(12) United States Patent
Shimizu

(10) Patent No.: US 11,882,697 B2
(45) Date of Patent: Jan. 23, 2024

(54) METHOD OF MANUFACTURING SEMICONDUCTOR DEVICE

(71) Applicant: RENESAS ELECTRONICS CORPORATION, Tokyo (JP)

(72) Inventor: Shu Shimizu, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 17/697,380

(22) Filed: Mar. 17, 2022

(65) Prior Publication Data

US 2022/0352189 A1 Nov. 3, 2022

(30) Foreign Application Priority Data

Apr. 30, 2021 (JP) .................................. 2021-077655

(51) Int. Cl.
| | |
|---|---|
| *H01L 29/788* | (2006.01) |
| *H01L 27/06* | (2006.01) |
| *H01L 21/70* | (2006.01) |
| *H10B 41/42* | (2023.01) |
| *H01L 29/66* | (2006.01) |

(52) U.S. Cl.
CPC ....... *H10B 41/42* (2023.02); *H01L 29/66825* (2013.01); *H01L 29/7883* (2013.01)

(58) Field of Classification Search
CPC .............................................. H01L 21/823462
See application file for complete search history.

(56) References Cited

U.S. PATENT DOCUMENTS

| | | | |
|---|---|---|---|
| 2002/0104822 A1* | 8/2002 | Naydenkov | G02B 6/122 216/24 |
| 2002/0197800 A1 | 12/2002 | Hashimoto et al. | |
| 2004/0248367 A1* | 12/2004 | Shyu | H10B 69/00 438/257 |
| 2005/0250342 A1 | 11/2005 | Ueda | |
| 2008/0029806 A1* | 2/2008 | Takebuchi | H10B 41/46 257/E21.639 |
| 2016/0111295 A1 | 4/2016 | Shih et al. | |

FOREIGN PATENT DOCUMENTS

JP 2019-079938 A 5/2019

OTHER PUBLICATIONS

Extended European Search Report issued in corresponding European Patent Application No. 22166716.5-1212, dated Sep. 22, 2022.

* cited by examiner

*Primary Examiner* — Xiaoming Liu
(74) *Attorney, Agent, or Firm* — Rimon, P.C.

(57) ABSTRACT

A non-volatile semiconductor memory and three or more types of transistors are provided. A thickness of a first gate oxide film of a first transistor is larger than that of a second gate oxide film of a second transistor, and is smaller than that of a third gate oxide film of a third transistor. In a first transistor region, a first silicon oxide film is formed on a surface of a semiconductor substrate, and second and third silicon oxide films are formed on the first silicon oxide film. By removing the second and third silicon oxide films and a part of an upper layer of the first silicon oxide film, the first gate oxide film is formed from the first silicon oxide film.

9 Claims, 40 Drawing Sheets

METHOD OF MANUFACTURING SEMICONDUCTOR DEVICE

CROSS-REFERENCE TO RELATED APPLICATIONS

The disclosure of Japanese Patent Application No. 2021-077655 filed on Apr. 30, 2021 including the specification, drawings and abstract is incorporated herein by reference in its entirety.

BACKGROUND

The present invention relates to a method of manufacturing a semiconductor device, and can be suitably applied to a method of manufacturing a semiconductor device including a non-volatile semiconductor memory and three or more types of field effect transistors having gate oxide films whose thicknesses are different from each other.

Conventionally, a semiconductor device including a non-volatile semiconductor memory and three types of field effect transistors having gate oxide films whose thicknesses are different from each other is disclosed in, for example, Japanese Unexamined Patent Application Publication No. 2019-79938 (Patent Document 1). Patent Document 1 discloses a flash memory, a high withstand voltage MOS (Metal Oxide Semiconductor) transistor, a low withstand voltage MOS transistor, and a novel MOS transistor having withstand voltage between the high withstand voltage and the low withstand voltage.

A gate oxide film of the novel MOS transistor is formed by the CVD (Chemical Vapor Deposition) method after a floating gate electrode of the flash memory is formed. Further, the gate oxide film of the novel MOS transistor is used also as a part of a gate oxide film of the high withstand voltage MOS transistor.

There are Disclosed Techniques Listed Below

[Patent Document 1] Japanese Unexamined Patent Application Publication No. 2019-79938

SUMMARY

In the manufacturing method of Patent Document 1, the gate oxide film of the novel MOS transistor is used also as a part of the gate oxide film of the high withstand voltage MOS transistor. Therefore, the formation of the gate oxide film of the novel MOS transistor greatly affects the manufacturing flow of the other transistors including the high withstand voltage MOS transistor. Accordingly, there are many restrictions when forming the gate oxide film of the novel MOS transistor.

The other problems and novel features will be apparent from the description of the specification and the accompanying drawings.

A method of manufacturing a semiconductor device according to an embodiment is a method of manufacturing a semiconductor device including a non-volatile semiconductor memory, a first transistor, a second transistor, and a third transistor. The first transistor includes a first gate oxide film having a first film thickness. The second transistor includes a second gate oxide film having a second film thickness smaller than the first film thickness. The third transistor includes a third gate oxide film having a third film thickness larger than the first film thickness. In the method of manufacturing the semiconductor device, an oxide film is first formed on a surface of a semiconductor substrate in a formation region of the first transistor. In the formation region of the first transistor, a first etched film is formed on the oxide film. By removing the first etched film and a part of an upper layer of the oxide film, the first gate oxide film having the first film thickness is formed from the oxide film.

By the method of manufacturing the semiconductor device according to the embodiment, it is possible to manufacture the first transistor without greatly affecting the manufacturing flow of the other transistors.

DETAILED DESCRIPTION

Figure 1:
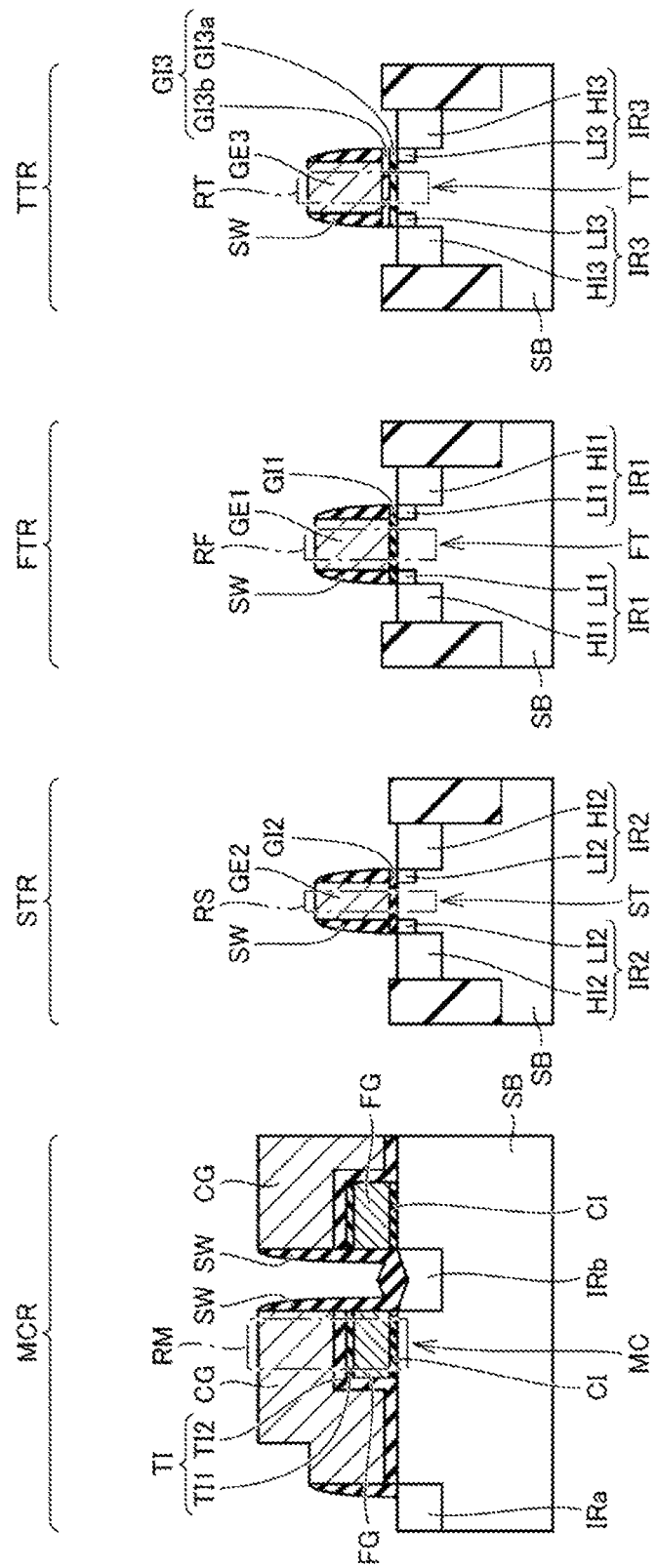
FIG. 1 is a cross-sectional view showing a configuration of a semiconductor device according to the first embodiment.

Hereinafter, the embodiments of this disclosure will be described in detail with reference to drawings. In the specification and drawings, the same components or corresponding components are denoted by the same reference characters, and duplicate descriptions will not be repeated. Also, in the drawings, the configuration or the manufacturing method may be omitted or simplified for convenience of description. Further, at least a part of each embodiment and each modification may be arbitrarily combined with each other.

First Embodiment

<Configuration of Semiconductor Device>

First, a configuration of a semiconductor device according to the first embodiment will be described with reference to FIG. 1 and FIG. 2.

As shown in FIG. 1, the semiconductor device according to the present embodiment includes a non-volatile semiconductor memory MC, a first transistor FT, a second transistor ST, and a third transistor TT.

The non-volatile semiconductor memory MC is arranged in a memory region MCR. The first transistor FT is arranged in a first transistor region FTR (formation region of the first transistor FT). The second transistor ST is arranged in a second transistor region STR. The third transistor TT is arranged in a third transistor region TTR.

The non-volatile semiconductor memory MC is, for example, a split-gate flash memory. The non-volatile semiconductor memory MC includes a pair of impurity regions IRa and IRb, a coupling oxide film CI, a floating gate electrode FG, a tunnel oxide film TI, and a control gate electrode CG.

One of the pair of impurity regions IRa and IRb functions as a source region, and the other functions as a drain region. When writing the stored contents, the impurity region IRa functions as a source region and the impurity region IRb functions as a drain region. When reading the stored contents, the impurity region IRa functions as a drain region and the impurity region IRb functions as a source region.

The impurity regions IRa and IRb are arranged in a surface of a semiconductor substrate SB at a distance from each other. The semiconductor substrate SB is made of, for example, single crystal silicon. The pair of impurity regions IRa and IRb is configured by introducing, for example, an n-type impurity into the surface of the semiconductor substrate SB.

The floating gate electrode FG is arranged on the surface of the semiconductor substrate SB sandwiched between the pair of impurity regions IRa and IRb with the coupling oxide film CI interposed therebetween. The coupling oxide film CI is, for example, a silicon oxide film formed by thermally oxidizing the surface of the semiconductor substrate SB made of silicon. The coupling oxide film CI has a thickness of, for example, 100 Å (angstrom).

The floating gate electrode FG is made of, for example, polycrystalline silicon (doped polysilicon) into which an impurity has been introduced. The floating gate electrode FG has a thickness of, for example, 1000 Å (angstrom).

The control gate electrode CG is arranged on the floating gate electrode FG with the tunnel oxide film TI interposed therebetween. The tunnel oxide film TI includes an oxide film TI1 and an oxide film TI2. The oxide film TI1 is in contact with an upper surface of the floating gate electrode FG. The oxide film TI2 is in contact with an upper surface of the oxide film TI1, a side surface of the floating gate electrode FG, and the surface of the semiconductor substrate SB.

The oxide film TI1 has a stacked structure of, for example, a silicon oxide film formed by the RTO (Rapid Thermal Oxidation) and a silicon oxide film formed by the HTO (High Temperature Oxidation). The RTO is a type of thermal oxidation method. The HTO is a type of chemical vapor deposition method (CVD method). The oxide film TI1 has a thickness of, for example, 48 Å (angstrom).

The oxide film TI2 is, for example, a silicon oxide film formed by the HTO. The oxide film TI2 has a thickness of, for example, 139 Å (angstrom). The control gate electrode CG is made of, for example, doped polysilicon.

The control gate electrode CG faces the upper surface of the floating gate electrode FG with the oxide films TI1 and TI2 interposed therebetween. Further, the control gate electrode CG faces a side surface of the floating gate electrode FG and the surface of the semiconductor substrate SB with the oxide film TI2 interposed therebetween. The oxide film TI2 located between the semiconductor substrate SB and the control gate electrode CG functions as a gate oxide film. A side wall of the control gate electrode CG is covered with a sidewall insulating film SW.

Each of the first transistor FT, the second transistor ST, and the third transistor TT is an insulated gate field effect transistor, and is a MOS transistor using a silicon oxide film as the gate insulating film. Each of the first transistor FT, the second transistor ST, and the third transistor TT is configured so as to have different drive voltages.

The drive voltage of the first transistor FT is higher than the drive voltage of the second transistor ST and lower than the drive voltage of the third transistor TT. The drive voltage of the first transistor FT is, for example, 3.3 V. The first transistor FT is used as, for example, a transistor of an analog circuit such as an AD (Analog Digital) converter.

The drive voltage of the second transistor ST is, for example, 1.5 V. The second transistor ST is, for example, a core transistor. The core transistor means a transistor having the highest driving ability in a semiconductor device.

The drive voltage of the third transistor TT is, for example, 5.0 V. The third transistor TT is, for example, a transistor used for an IO (Input Output) interface.

The transistors FT, ST, and TT have gate oxide films GI1, GI2, and GI3 having different film thicknesses, respectively.

The film thickness of the gate oxide film GI2 in the second transistor ST is smaller than the film thickness of the gate oxide film GI1 in the first transistor FT. The film thickness of the gate oxide film GI3 in the third transistor TT is larger than the film thickness of the gate oxide film GI1 in the first transistor FT.

The first transistor FT has a pair of impurity regions IR1, a gate oxide film GI1, and a gate electrode GE1. One of the impurity regions IR1 functions as a source region and the other functions as a drain region. Each of the impurity regions IR1 has a high concentration region HI1 and a low concentration region LI1, and has an LDD (Lightly Doped Drain) structure. Each of the impurity regions IR1 is arranged in the surface of the semiconductor substrate SB. The gate electrode GE1 is arranged on the surface of the semiconductor substrate SB sandwiched between the pair of impurity regions IR1 with the gate oxide film GI1 interposed therebetween. A side wall of the gate electrode GE1 is covered with a sidewall insulating film SW.

The gate oxide film GI1 is, for example, a silicon oxide film formed by thermally oxidizing the surface of the semiconductor substrate SB made of silicon. The gate oxide film GI1 has a thickness of, for example, 75 Å (angstrom). The gate electrode GE1 is made of, for example, doped polysilicon.

The second transistor ST has a pair of impurity regions IR2, a gate oxide film GI2, and a gate electrode GE2. One of the impurity regions IR2 functions as a source region and the other functions as a drain region. Each of the impurity regions IR2 has a high concentration region HI2 and a low concentration region LI2, and has an LDD structure. Each of the impurity regions IR2 is arranged in the surface of the semiconductor substrate SB. The gate electrode GE2 is arranged on the surface of the semiconductor substrate SB sandwiched between the pair of impurity regions IR2 with the gate oxide film GI2 interposed therebetween. A side wall of the gate electrode GE2 is covered with a sidewall insulating film SW.

The gate oxide film GI2 is, for example, a silicon oxide film formed by thermally oxidizing the surface of the semiconductor substrate SB made of silicon. The gate oxide film GI2 has a thickness of, for example, 27 Å (angstrom). The gate electrode GE2 is made of, for example, doped polysilicon.

The third transistor TT has a pair of impurity regions IR3, a gate oxide film GI3, and a gate electrode GE3. One of the impurity regions IR3 functions as a source region and the other functions as a drain region. Each of the impurity regions IR3 has a high concentration region HI3 and a low concentration region LI3, and has an LDD structure. Each of the impurity regions IR3 is arranged in the surface of the semiconductor substrate SB. The gate electrode GE3 is arranged on the surface of the semiconductor substrate SB sandwiched between the pair of impurity regions IR3 with the gate oxide film GI3 interposed therebetween. A side wall of the gate electrode GE3 is covered with a sidewall insulating film SW.

The gate oxide film GI3 has an oxide film GI3*a* and an oxide film GI3*b*. The oxide film GI3*a* is in contact with the surface of the semiconductor substrate SB. The oxide film GI3*b* is in contact with an upper surface of the oxide film GI3*a*. The gate electrode GE3 is in contact with an upper surface of the oxide film GI3*b*.

The oxide film GI3*a* has a stacked structure of, for example, a silicon oxide film formed by the RTO and a silicon oxide film formed by the HTO. The oxide film GI3*a* has a thickness of, for example, 48 Å (angstrom). The oxide film GI3*b* is, for example, a silicon oxide film formed by the HTO. The oxide film GI3*b* has a thickness of, for example, 139 Å (angstrom). The gate electrode GE3 is made of, for example, doped polysilicon.

Figure 2:
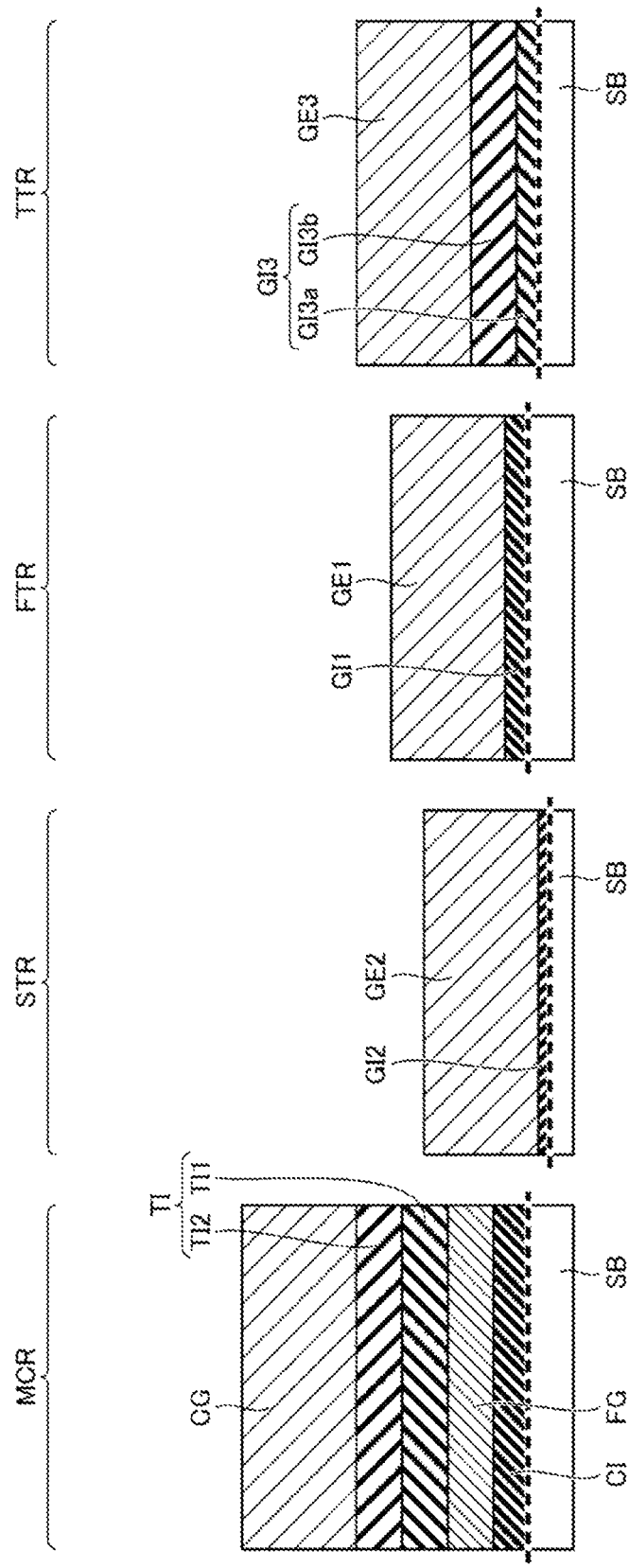
FIG. 2 is a partially enlarged cross-sectional view showing regions RM, RF, RS, and RT of FIG. 1 in an enlarged manner.

FIG. 2 is a partially enlarged cross-sectional view showing regions RM, RF, RS, and RT of FIG. 1 in an enlarged manner. As shown in FIG. 2, an interface between the semiconductor substrate SB and the gate oxide film GI1 in the first transistor region FTR is located on a lower side than an interface between the semiconductor substrate SB and the coupling oxide film CI in the memory region MCR. The height difference between the interface between the semiconductor substrate SB and the coupling oxide film CI in the memory region MCR and the interface between the semiconductor substrate SB and the gate oxide film GI1 in the first transistor region FTR is less than 44% of the thickness of the gate oxide film GI2 in the second transistor region STR.

Also, an interface between the semiconductor substrate SB and the gate oxide film GI3 in the third transistor region TTR is located on a lower side than the interface between the semiconductor substrate SB and the gate oxide film GI1 in the first transistor region FTR. An interface between the semiconductor substrate SB and the gate oxide film GI2 in the second transistor region STR is located on a lower side than the interface between the semiconductor substrate SB and the gate oxide film GI3 in the third transistor region TTR.

<Operation of Non-Volatile Semiconductor Memory MC>

Next, the operation of the non-volatile semiconductor memory MC shown in FIG. 1 will be described.

As shown in FIG. 1, when writing data, the impurity region IRb is made to have a higher potential than the impurity region IRa. As a result, hot electrons (electrons in a high energy state) are generated in the channel under the floating gate electrode FG on the side closer to the impurity region IRa. The hot electrons are injected into the floating gate electrode FG through the coupling oxide film CI. In this way, data is written.

When erasing data, a predetermined voltage is applied to the control gate electrode CG. As a result, the electrons accumulated in the floating gate electrode FG are extracted to the control gate electrode CG through the tunnel oxide film TI. In this way, data is erased.

When reading data, predetermined voltages are applied to the control gate electrode CG and the impurity region IRa. At this time, data read determination is performed depending on whether or not a current (reading current) flows between the impurity region IRa and the impurity region IRb.

<Method of Manufacturing Semiconductor Device>

Next, a method of manufacturing the semiconductor device according to the present embodiment will be described with reference to FIG. 3 to FIG. 12.

Figure 3:
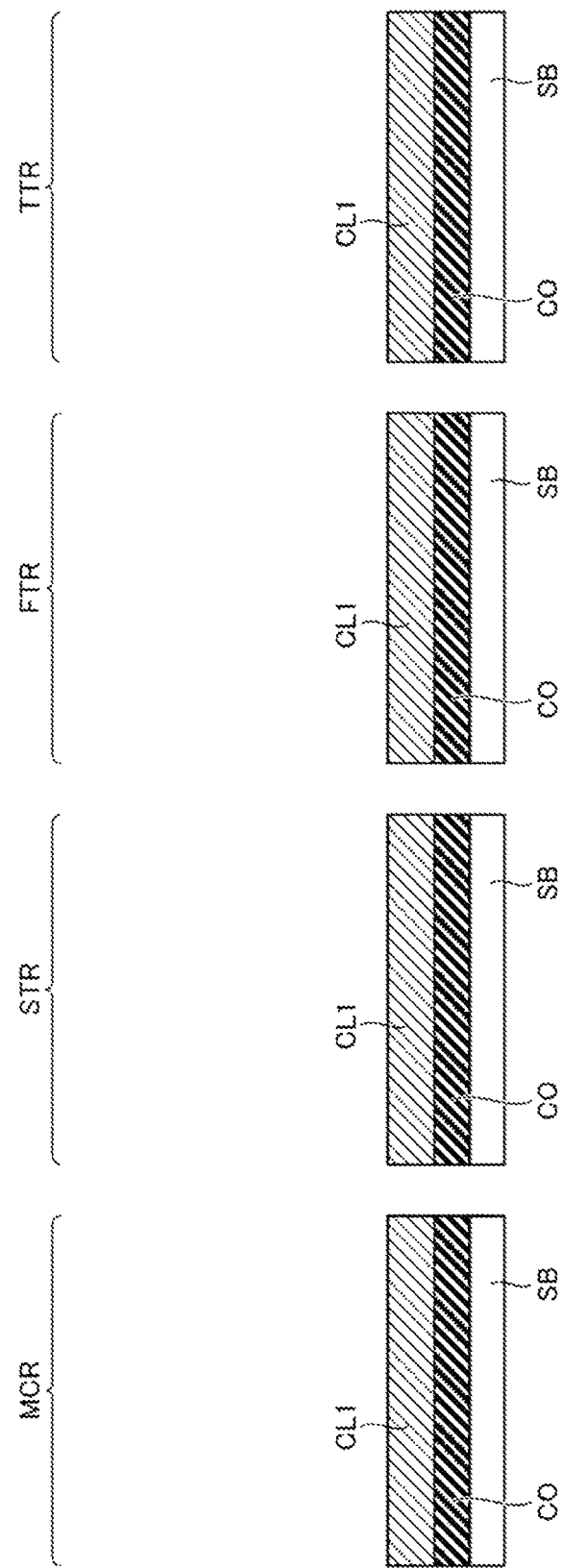
FIG. 3 is a cross-sectional view showing a first step of a method of manufacturing a semiconductor device according to the first embodiment.

As shown in FIG. 3, the semiconductor substrate SB made of, for example, single crystal silicon is prepared. Then, STI (Shallow Trench Isolation) is formed in the surface of the semiconductor substrate SB. The STI is formed by forming a trench in the surface of the semiconductor substrate SB and filling the trench with an insulating film. After forming the STI, a well is formed in the semiconductor substrate SB. Thereafter, an underlying oxide film is removed by wet etching.

After removing the underlying oxide film, the surface of the semiconductor substrate SB is thermally oxidized. As a result, in each of the memory region MCR and the transistor regions FTR, STR, and TTR, a silicon oxide film CO made of a thermal oxide film is formed to have a thickness of, for example, 100 Å (angstrom) on the surface of the semiconductor substrate SB. The silicon oxide film CO is an oxide film for forming the coupling oxide film CI in the non-volatile semiconductor memory MC (oxide film for forming coupling oxide film).

In each of the memory region MCR and the transistor regions FTR, STR, and TTR, a conductive film CL1 is formed on a surface of the silicon oxide film CO. The conductive film CL1 is a conductive film for forming the floating gate electrode FG in the non-volatile semiconductor memory MC (conductive film for forming floating gate electrode). The conductive film CL1 is formed to have a thickness of, for example, 1000 Å (angstrom). The conductive film CL1 is made of, for example, doped polysilicon.

Figure 4:
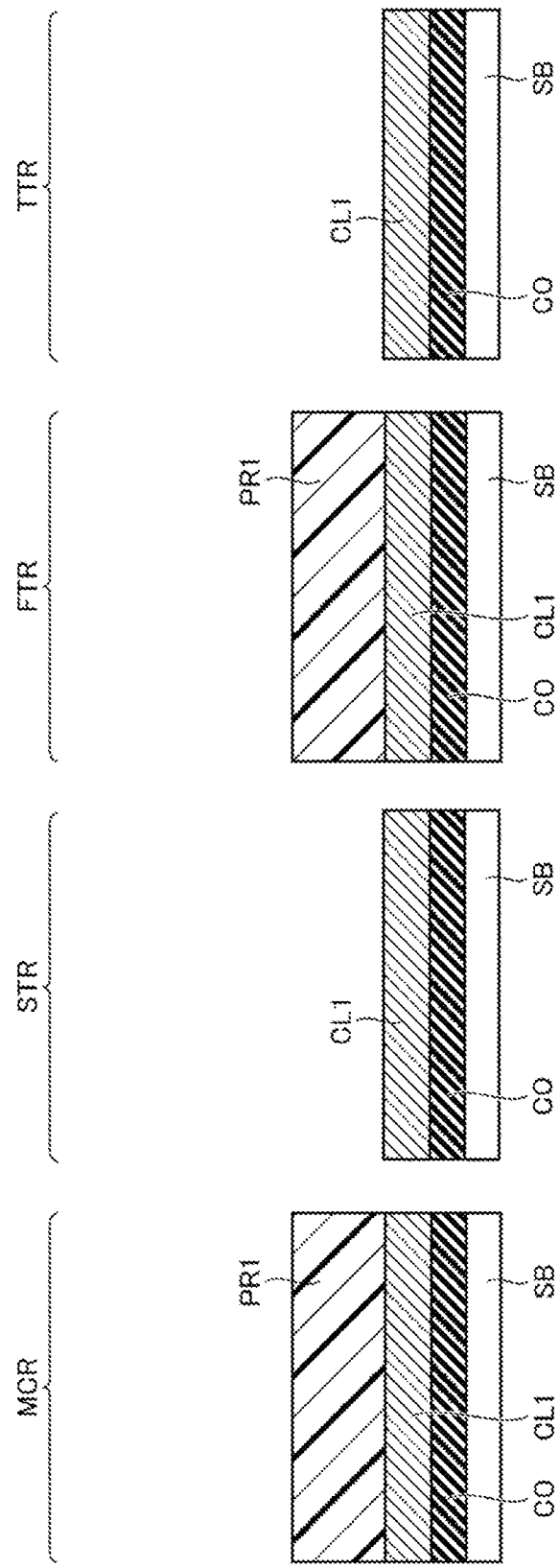
FIG. 4 is a cross-sectional view showing a second step of the method of manufacturing the semiconductor device according to the first embodiment.

As shown in FIG. 4, a photoresist PR1 is applied to the entire surface of the semiconductor substrate SB, and then selectively exposed and developed. As a result, a resist pattern PR1 covering each of the memory region MCR and the first transistor region FTR is formed.

Then, dry etching is performed using the resist pattern PR1 as a mask. The conductive film CL1 is removed by the dry etching in the second transistor region STR and the third transistor region TTR, and the surface of the silicon oxide film CO is exposed. Thereafter, the resist pattern PR1 is peeled off and removed by acid.

Figure 5:
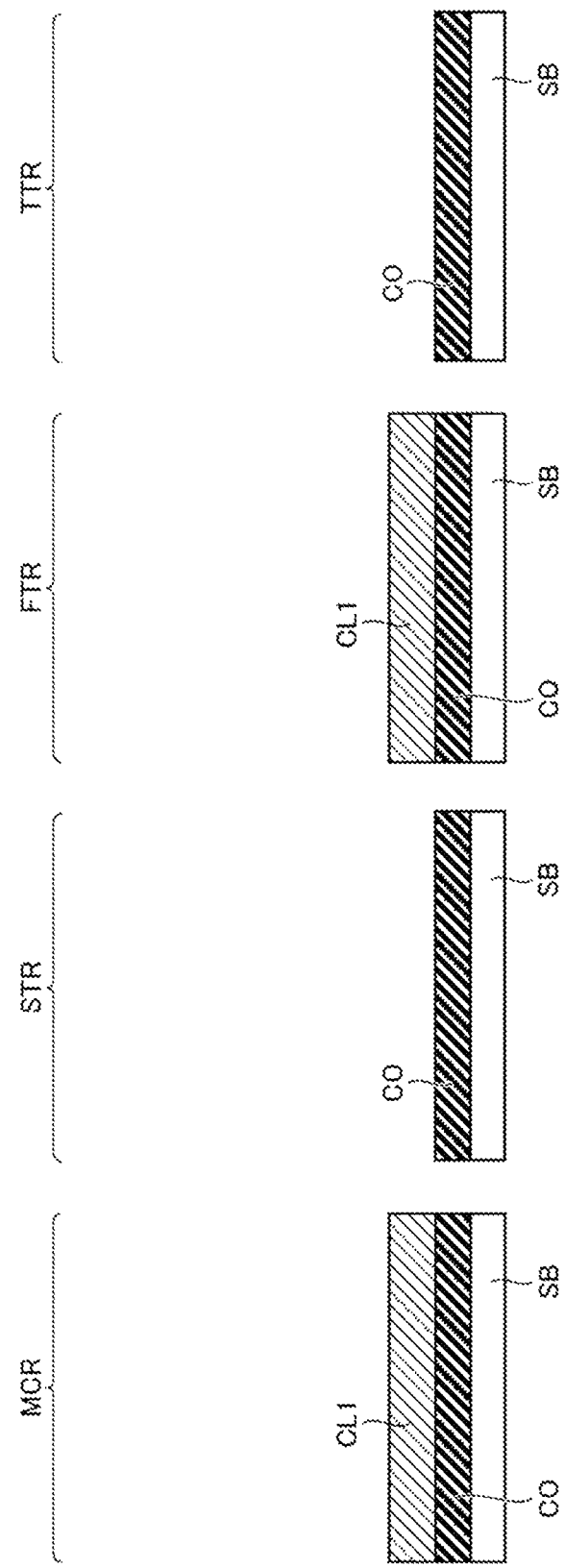
FIG. 5 is a cross-sectional view showing a third step of the method of manufacturing the semiconductor device according to the first embodiment.

As shown in FIG. 5, the silicon oxide film CO exposed in the second transistor region STR and the third transistor region TTR is removed by etching. As a result, the surface of the semiconductor substrate SB is exposed in the second transistor region STR and the third transistor region TTR.

Figure 6:
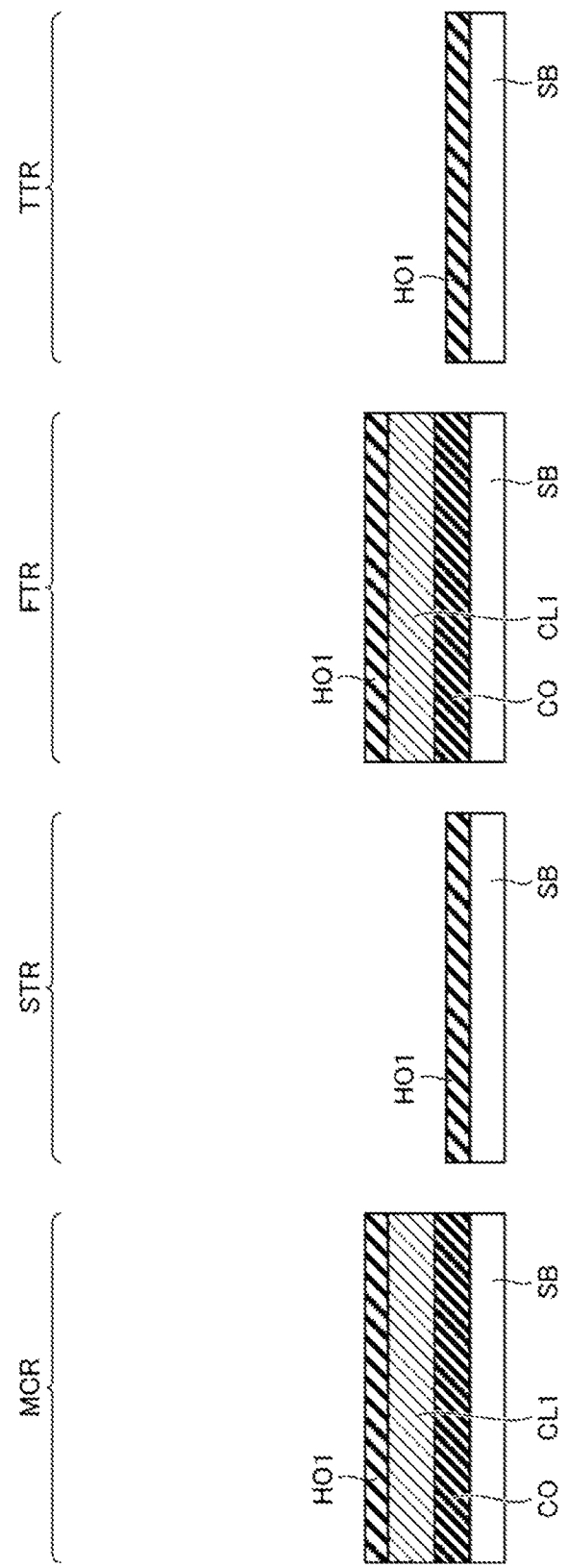
FIG. 6 is a cross-sectional view showing a fourth step of the method of manufacturing the semiconductor device according to the first embodiment.

As shown in FIG. 6, thermal oxidation is performed by the RTO on the entire surface of the semiconductor substrate SB. As a result, a silicon oxide film by the thermal oxidation is formed in each of the memory region MCR and the transistor regions FTR, STR, and TTR. Also, a silicon oxide film is deposited by the HTO on the entire surface of the semiconductor substrate SB. Consequently, a silicon oxide film HO1 having a stacked structure of the silicon oxide film formed by the RTO and the silicon oxide film formed by the HTO is formed in each of the memory region MCR and the transistor regions FTR, STR, and TTR. The silicon oxide film HO1 is formed to have a thickness of, for example, 48 Å (angstrom).

Figure 7:
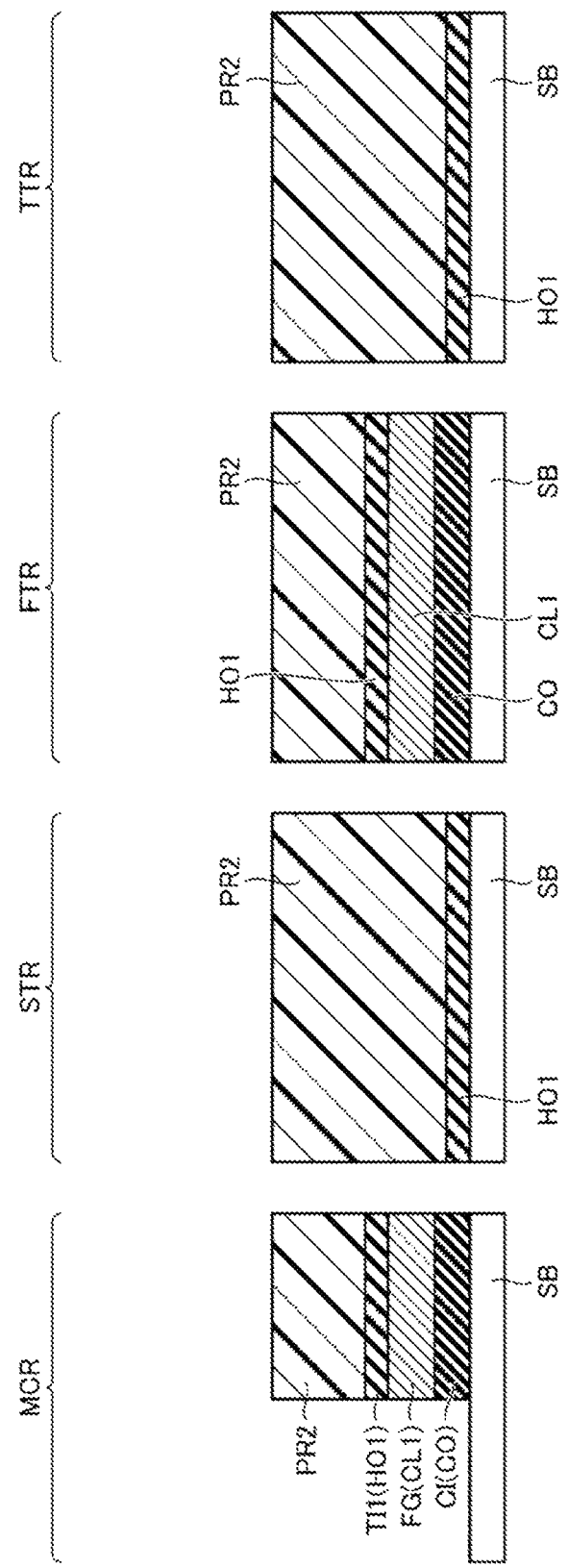
FIG. 7 is a cross-sectional view showing a fifth step of the method of manufacturing the semiconductor device according to the first embodiment.

As shown in FIG. 7, a photoresist PR2 is applied to the entire surface of the semiconductor substrate SB, and then selectively exposed and developed. As a result, a resist pattern PR2 covering a part of the memory region MCR and each of the transistor regions FTR, STR, and TTR is formed.

Then, wet etching is performed using the resist pattern PR2 as a mask. By this wet etching, the silicon oxide film HO1 is selectively removed in the memory region MCR, and the conductive film CL1 is exposed. Thereafter, dry etching is performed. By this dry etching, the exposed conductive film CL1 is selectively removed, and the silicon oxide film CO is exposed. Then, wet etching is performed. By this wet etching, the exposed silicon oxide film CO is selectively removed, and the surface of the semiconductor substrate SB is exposed.

As a result, in the memory region MCR, the coupling oxide film CI is formed from the silicon oxide film CO, the floating gate electrode FG is formed from the conductive film CL1, and the silicon oxide film TI1 constituting a part of the tunnel oxide film is formed from the silicon oxide film HO1. Thereafter, the resist pattern PR2 is peeled off and removed by acid.

Figure 8:
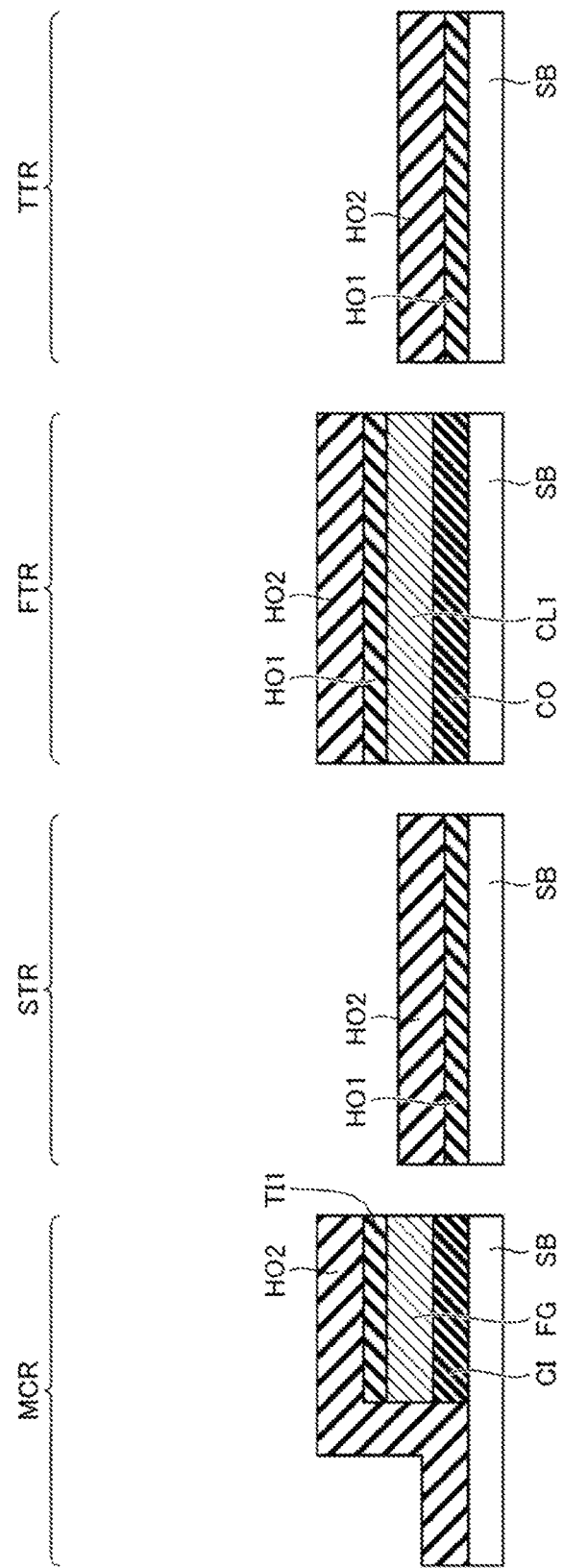
FIG. 8 is a cross-sectional view showing a sixth step of the method of manufacturing the semiconductor device according to the first embodiment.

As shown in FIG. 8, a silicon oxide film HO2 is deposited by the HTO on the entire surface of the semiconductor substrate SB. The silicon oxide film HO2 is formed to have a thickness of, for example, 139 Å (angstrom).

Figure 9:
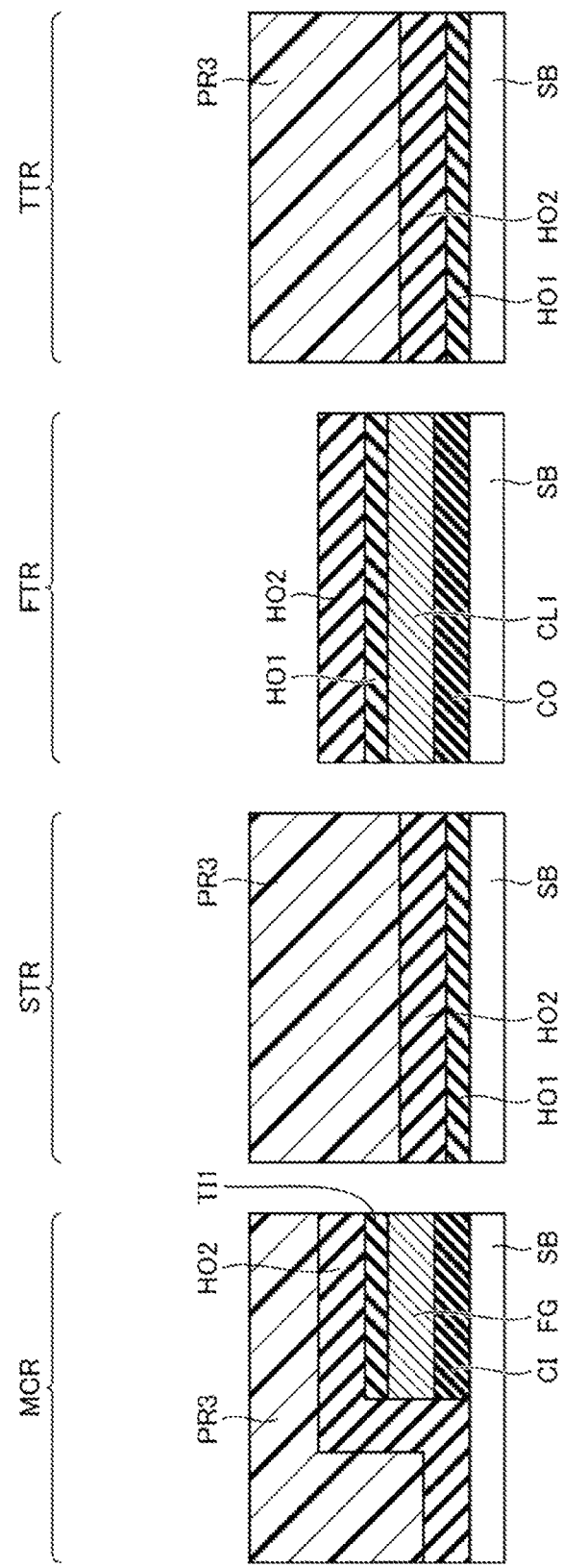
FIG. 9 is a cross-sectional view showing a seventh step of the method of manufacturing the semiconductor device according to the first embodiment.

As shown in FIG. 9, a photoresist PR3 is applied to the entire surface of the semiconductor substrate SB, and then selectively exposed and developed. As a result, a resist pattern PR3 covering each of the memory region MCR, the second transistor region STR, and the third transistor region TTR is formed.

Then, wet etching is performed using the resist pattern PR3 as a mask. By this wet etching, the silicon oxide films HO2 and HO1 are selectively removed in the first transistor region FTR, and the conductive film CL1 is exposed. Thereafter, dry etching is performed.

This dry etching is performed by, for example, chemical dry etching (CDE). By this dry etching, the exposed conductive film CL1 is selectively removed, and the silicon oxide film CO is exposed.

Figure 10:
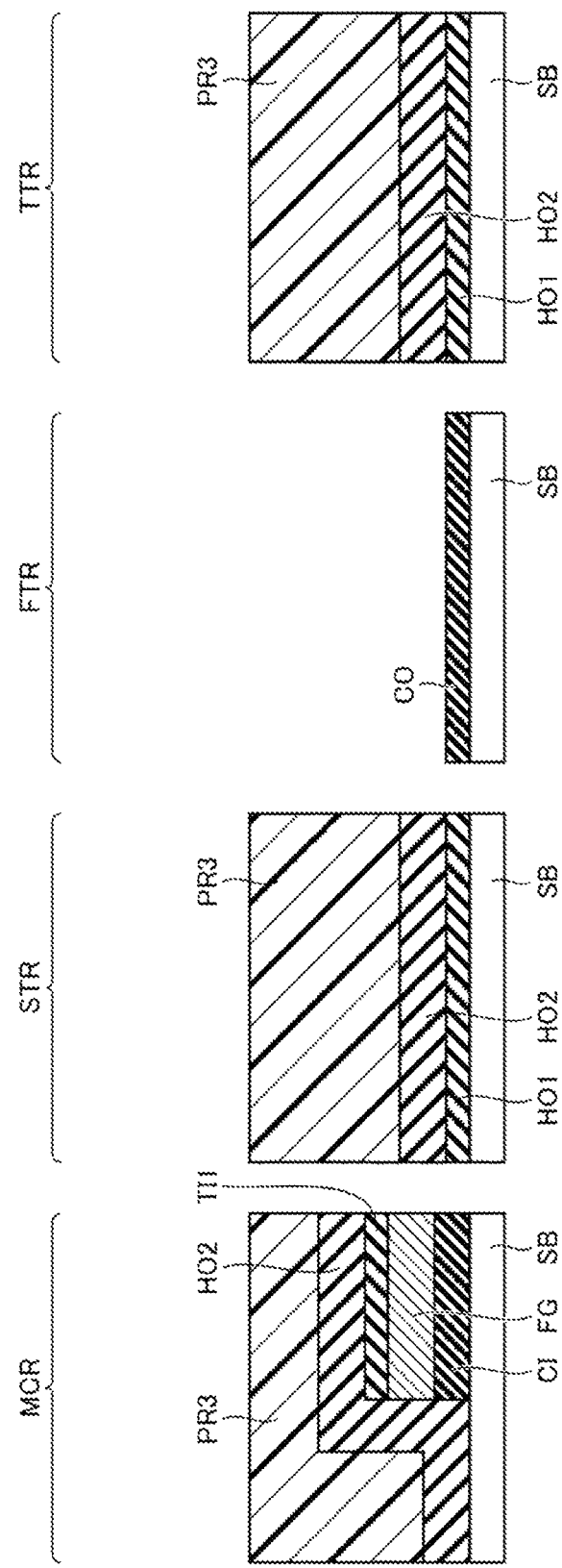
FIG. 10 is a cross-sectional view showing an eighth step of the method of manufacturing the semiconductor device according to the first embodiment.

As shown in FIG. 10, during the above-mentioned dry etching, a part of the upper layer of the exposed silicon oxide film CO is also overetched and removed. By adjusting the overetching of the CDE, the thickness of the residual silicon oxide film CO is adjusted to, for example, 75 Å (angstrom). Thereafter, the resist pattern PR3 is peeled off and removed by acid.

Figure 11:
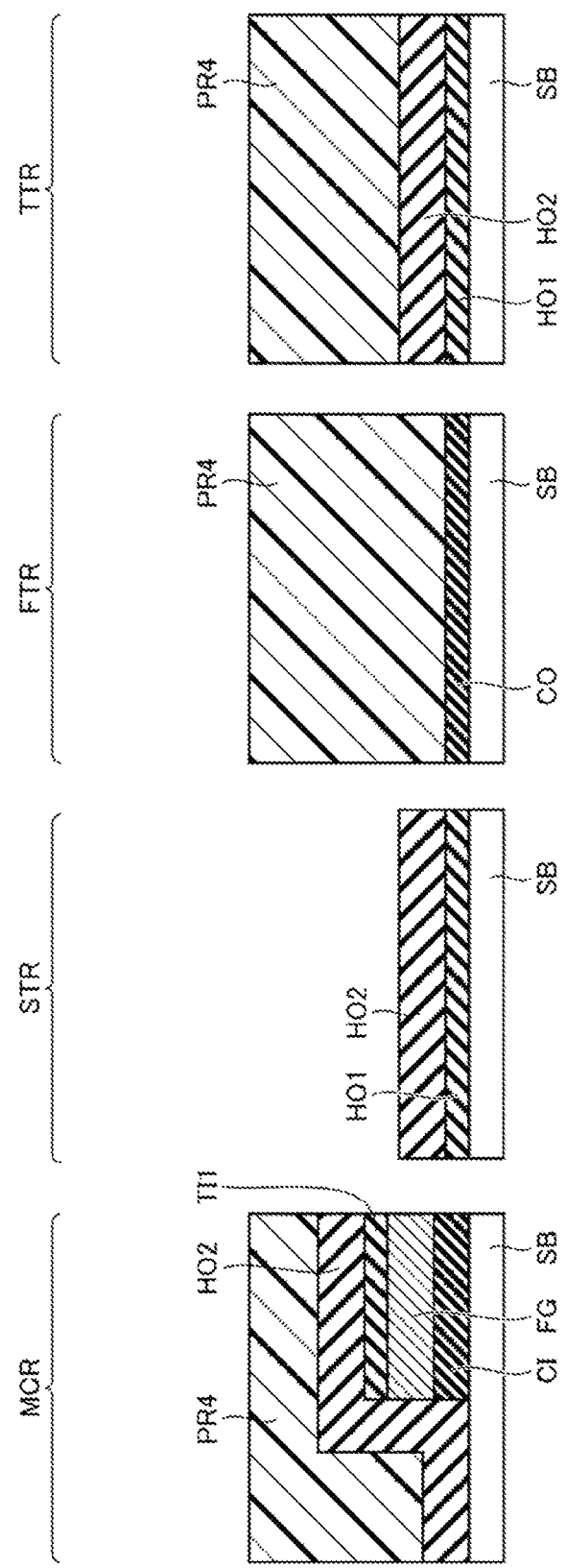
FIG. 11 is a cross-sectional view showing a ninth step of the method of manufacturing the semiconductor device according to the first embodiment.

As shown in FIG. 11, a photoresist PR4 is applied to the entire surface of the semiconductor substrate SB, and then selectively exposed and developed. As a result, a resist pattern PR4 covering each of the memory region MCR, the first transistor region FTR, and the third transistor region TTR is formed.

Then, wet etching is performed using the resist pattern PR4 as a mask. By this wet etching, the silicon oxide films HO2 and HO1 are selectively removed in the second transistor region STR, and the surface of the semiconductor substrate SB is exposed. Thereafter, the resist pattern PR4 is peeled off and removed by acid.

Figure 12:
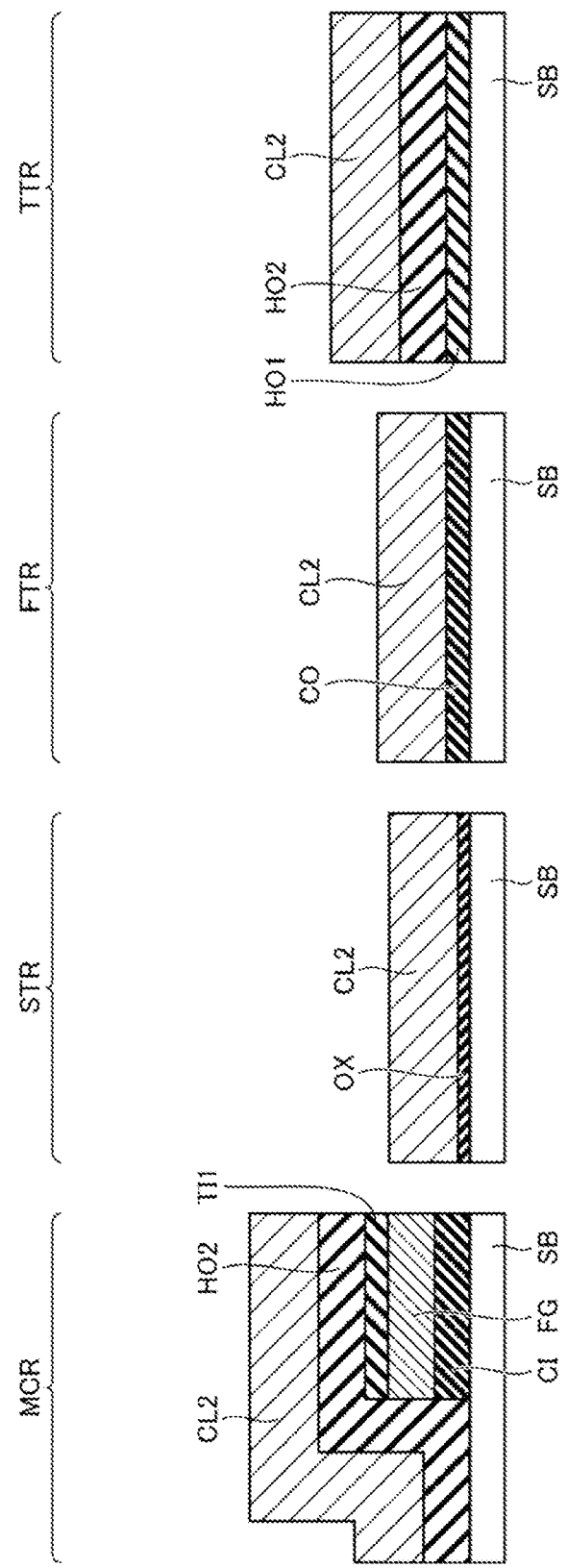
FIG. 12 is a cross-sectional view showing a tenth step of the method of manufacturing the semiconductor device according to the first embodiment.

As shown in FIG. 12, the surface of the semiconductor substrate SB is thermally oxidized. As a result, in the second transistor region STR, a silicon oxide film OX made of a thermal oxide film is formed to have a thickness of, for example, 27 Å (angstrom) on the surface of the semiconductor substrate SB.

Then, a conductive film CL2 is formed in each of the memory region MCR and the transistor regions FTR, STR, and TTR. The conductive film CL2 is made of, for example, doped polysilicon.

Figure 13:
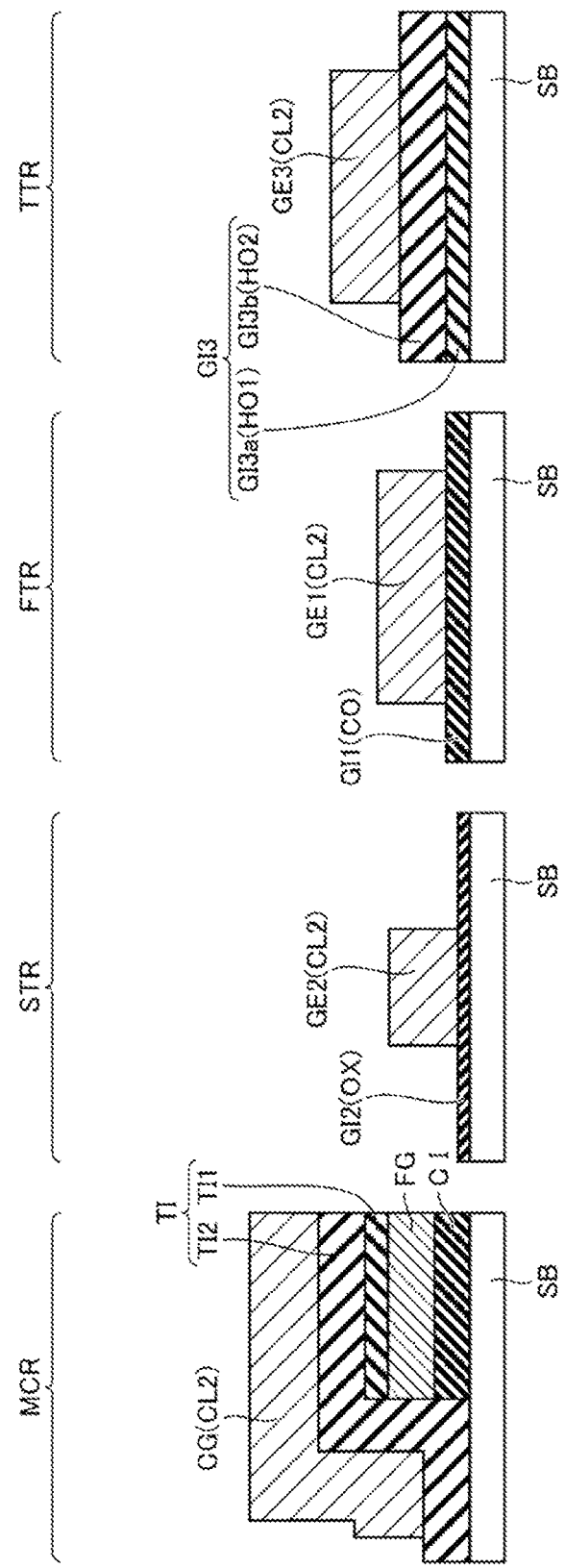
FIG. 13 is a cross-sectional view showing an eleventh step of the method of manufacturing the semiconductor device according to the first embodiment.

As shown in FIG. 13, the conductive film CL2 is patterned by the photoengraving technique and the etching technique. As a result, in the memory region MCR, the control gate electrode CG is formed from the conductive film CL. In the first transistor region FTR, the gate electrode GE1 is formed from the conductive film CL2. In the second transistor region STR, the gate electrode GE2 is formed from the conductive film CL2. In the third transistor region TTR, the gate electrode GE3 is formed from the conductive film CL2.

Further, in the memory region MCR, the tunnel oxide film TI is formed from the silicon oxide films TI1 and TI2. In the first transistor region FTR, the gate oxide film GI1 is formed from the silicon oxide film CO. In the second transistor region STR, the gate oxide film GI2 is formed from the silicon oxide film OX. In the third transistor region TTR, the gate oxide film GI3 composed of the silicon oxide films GI3a and GI3b is formed from the silicon oxide films HO1 and HO2.

Thereafter, the impurity regions IRa, IRb, IR1, IR2, IR3 and the like constituting the source region and the drain region are formed, so that the semiconductor device according to the present embodiment shown in FIG. 1 is manufactured.

<Effect>

Next, the effects of the present embodiment will be described.

In the present embodiment, as shown in FIG. 3, the silicon oxide film CO is formed on the surface of the semiconductor substrate SB in the first transistor region FTR, and the silicon oxide films HO1 and HO2 (first etched films) are formed on the silicon oxide film CO as shown in FIG. 8. Thereafter, as shown in FIG. 9 and FIG. 10, in the first transistor region FTR, the silicon oxide films HO1 and HO2 and a part of the upper layer of the silicon oxide film CO are removed by etching. As a result, the gate oxide film GI1 (FIG. 13) of the first transistor FT is formed from the silicon oxide film CO.

As described above, the thickness of the gate oxide film GI1 is adjusted by removing a part of the upper layer of the silicon oxide film CO by etching. This makes it possible to adjust the film thickness of the gate oxide film GI1 separately from the gate oxide films GI2 and GI3 of the second transistor ST and the third transistor TT. Therefore, it is possible to form the gate oxide film GI1 without significantly affecting the formation of the gate oxide films GI2 and GI3 of the second transistor ST and the third transistor TT.

Further, in the present embodiment, as shown in FIG. 1, in addition to the non-volatile semiconductor memory MC, three or more types of transistors FT, ST, and TT having different drive voltages are present together. As described above, the drive voltage of the first transistor FT is, for example, 3.3 V, the drive voltage of the second transistor ST is, for example, 1.5 V, and the drive voltage of the third transistor TT is, for example, 5.0 V. The presence of the first transistor FT and the third transistor TT together in one chip has the following merits.

If all the transistors in one chip are configured only by the third transistor TT having the drive voltage of 5 V, the third transistor TT having the drive voltage of 5 V will be used also in an analog circuit such as an AD converter. However, since the analog circuit is operated at 3 V, there is a problem that the conversion speed becomes slow due to voltage drop.

On the other hand, if all the transistors in one chip are configured only by the first transistor FT having the drive voltage of 3 V, the voltage of the Li (lithium) ion battery exceeds 3.6 V. Therefore, it is necessary to always operate the DCDC (Direct Current to Direct Current) converter, and there is a problem that the standby current becomes large.

Also, although the above problems can be solved by preparing two chips, a chip composed only of the third transistors TT having the drive voltage of 5 V and a chip composed only of the first transistors FT having the drive voltage of 3 V, this increases the cost.

In the present embodiment, the third transistor TT having the drive voltage of 5 V and the first transistor FT having the drive voltage of 3 V are present together in one chip. Accordingly, the voltage of the IO interface has a withstand voltage of 5 V, power can be directly supplied from the Li-ion battery, and the standby current is reduced. Also, by using the first transistor FT having the drive voltage of 3 V for an analog circuit such as an AD converter and an IO interface used at 3 V, it is possible to realize an AD converter with optimum performance at the voltage of 3 V. Further, these merits are realized by one chip, which is also advantageous in terms of cost.

Also, according to the present embodiment, as shown in FIG. 9 and FIG. 10, the removal of the silicon oxide films HO2 and HO1 in the first transistor region FTR is performed by wet etching, and the removal of a part of the upper layer of the silicon oxide film CO is performed by dry etching. Accordingly, the damage due to etching is suppressed in the removal of the silicon oxide film HO1, and the controllability of the film thickness is improved in the removal of the upper layer of the silicon oxide film CO.

Further, according to the present embodiment, as shown in FIG. 8, the conductive film CL1 is formed between the silicon oxide film CO and the silicon oxide films HO1 and HO2 in the first transistor region FTR. The conductive film CL1 is a conductive film for forming the floating gate electrode FG in the non-volatile semiconductor memory MC. Accordingly, it is possible to remove a part of the upper layer of the silicon oxide film CO by the overetching when the conductive film CL1 for forming the floating gate electrode FG is etched.

Further, according to the present embodiment, as shown in FIG. 9 and FIG. 10, the silicon oxide film CO formed in the first transistor region FTR is an oxide film for forming the coupling oxide film CI in the non-volatile semiconductor memory MC. Accordingly, the gate oxide film GI1 of the first transistor FT can be formed from the same silicon oxide film as the coupling oxide film CI of the non-volatile semiconductor memory MC. Therefore, heat treatment at several hundred degrees Celsius or higher does not need to be performed at the time of forming the gate oxide film GI1 separately from that for forming the coupling oxide film CI.

In addition, there is almost no structural change in the existing parts (non-volatile semiconductor memory MC, second transistor ST, third transistor TTR, etc.) other than the first transistor FT due to the addition of the first transistor FT. Therefore, even if the first transistor FT is added, the risk of fluctuation in the characteristics and reliability of the non-volatile semiconductor memory MC and other elements can be reduced.

Further, since the gate oxide film GI1 of the first transistor FT can be formed as a thermal oxide film, the risk of reliability deterioration can be reduced as compared with the case of forming it by the CVD method.

Further, according to the present embodiment, as shown in FIG. 9 and FIG. 10, the dry etching for removing a part of the upper layer of the silicon oxide film CO in the first transistor region FTR is the CDE. The CDE is a so-called discharge chamber separated etching method in which the discharge chamber is separated from the etching chamber and the long-lived reactive species generated in the discharge chamber are transported to the etching chamber. In this method, heat, light, plasma, etc. do not reach the etching chamber from the discharge chamber, and ions hardly contribute to the etching. Therefore, damage of the etched film due to etching can be suppressed, and the gate oxide film GI1 having a good film quality can be obtained.

Second Embodiment

<Configuration of Semiconductor Device>

A configuration of a semiconductor device according to the second embodiment will be described with reference to FIG. 14 and FIG. 15.

Figure 14:
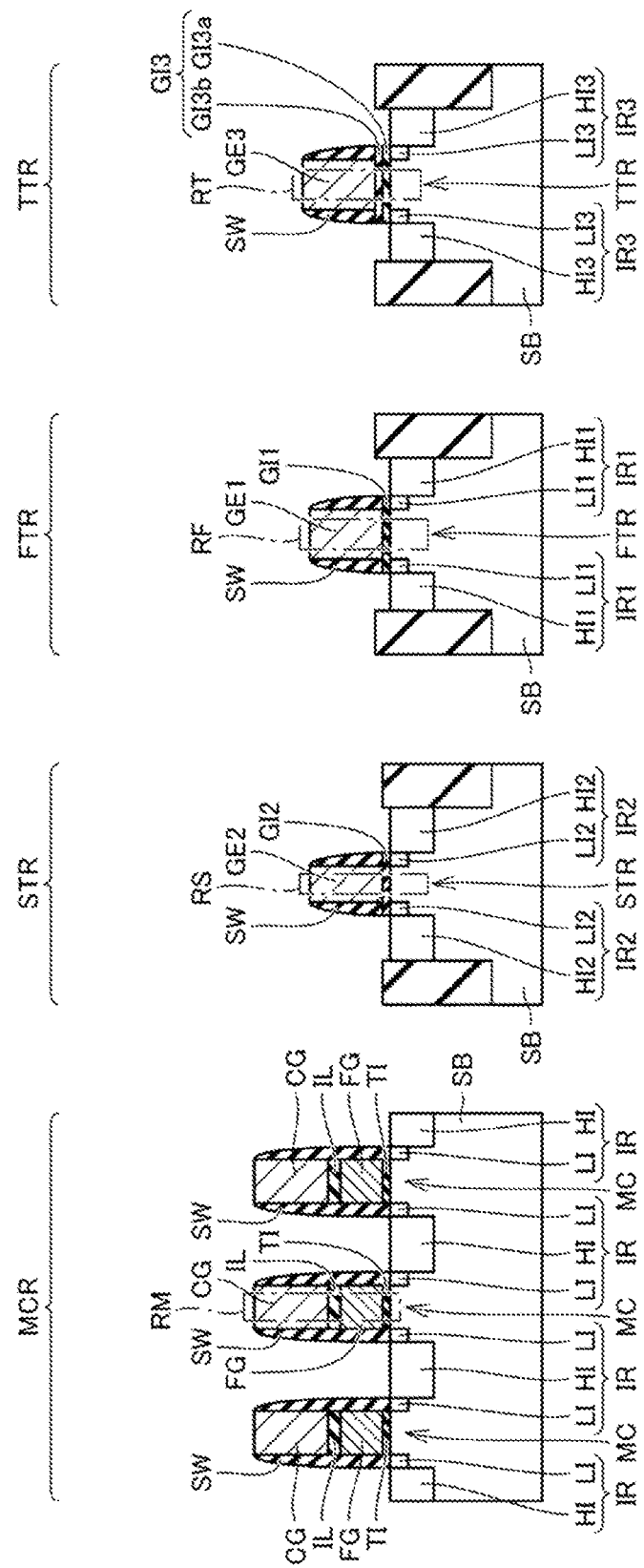
FIG. 14 is a cross-sectional view showing a configuration of a semiconductor device according to the second embodiment.

As shown in FIG. 14, the configuration of the semiconductor device according to the present embodiment is different from that of the first embodiment in the configuration of the non-volatile semiconductor memory MC. In the present embodiment, the non-volatile semiconductor memory MC is, for example, a stacked gate flash memory.

The non-volatile semiconductor memory MC includes a pair of impurity regions IR, a tunnel oxide film TI, a floating gate electrode FG, an insulating film IL, and a control gate electrode CG.

One of the impurity regions IR functions as a source region and the other functions as a drain region. The impurity regions IR are arranged in a surface of a semiconductor substrate SB at a distance from each other. The semiconductor substrate SB is made of, for example, single crystal silicon. The pair of impurity regions IR is configured by introducing, for example, an n-type impurity into the surface of the semiconductor substrate SB.

Each of the impurity regions IR has a high concentration region HI and a low concentration region LI, and may have an LDD (Lightly Doped Drain) structure. The high concentration region HI has an n-type impurity concentration higher than that of the low concentration region LI.

The floating gate electrode FG is arranged on the surface of the semiconductor substrate SB sandwiched between the pair of impurity regions IR with the tunnel oxide film TI interposed therebetween. The tunnel oxide film TI is a silicon oxide film formed by, for example, thermally oxidizing the surface of the semiconductor substrate SB made of silicon. The tunnel oxide film TI has a thickness of, for example, 100 Å (angstrom).

The floating gate electrode FG is made of, for example, doped polysilicon. The floating gate electrode FG has a thickness of, for example, 1000 Å (angstrom). The control gate electrode CG is arranged on the floating gate electrode FG with the insulating film IL interposed therebetween.

The insulating film IL has a thickness of, for example, 150 Å (angstrom). The control gate electrode CG is made of, for example, doped polysilicon. Each side wall of the floating gate electrode FG and the control gate electrode CG is covered with a sidewall insulating film SW.

Figure 15:
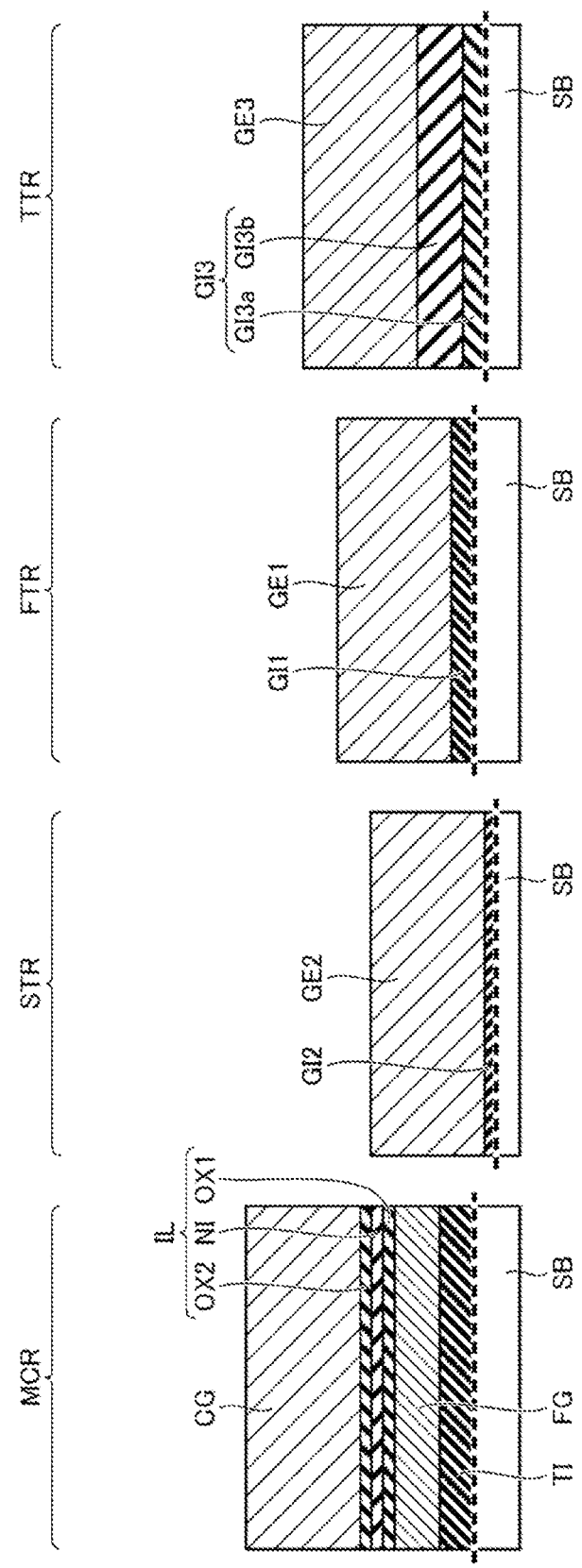
FIG. 15 is a partially enlarged cross-sectional view showing regions RM, RF, RS, and RT of FIG. 14 in an enlarged manner.

As shown in FIG. 15, the insulating film IL in the memory region MCR has a stacked structure composed of three layers of a silicon oxide film OX1, a silicon nitride film NI, and a silicon oxide film OX2. The silicon oxide film OX1 is in contact with an upper surface of the floating gate electrode FG. The silicon nitride film NI is in contact with an upper surface of the silicon oxide film OX1. The silicon oxide film OX2 is in contact with an upper surface of the silicon nitride film NI.

Since the configurations in the present embodiment other than those described above are almost the same as the configurations in the first embodiment, the same elements are denoted by the same reference characters and the description thereof will not be repeated.

<Operation of Non-Volatile Semiconductor Memory MC>

Next, the operation of the non-volatile semiconductor memory MC shown in FIG. 14 will be described.

As shown in FIG. 14, when writing data, one of the pair of impurity regions IR (drain) is made to have a higher potential than the other of the pair of impurity regions IR (source). As a result, the electric field near the drain is strengthened and the electrons are accelerated, so that hot electrons are generated. These hot electrons are injected into the floating gate electrode FG through the tunnel oxide film TI. In this way, data is written.

When erasing data, one of the pair of impurity regions IR (source) is made to have a high potential. As a result, a high electric field is applied between one of the pair of impurity regions IR (source) and the floating gate electrode FG, and the electrons accumulated in the floating gate electrode FG are extracted to one of the pair of impurity regions IR (source) through the tunnel oxide film TI by the Fowler Nordheim tunnel effect. In this way, data is erased.

When reading data, a voltage is applied between the pair of impurity regions IR, and a predetermined voltage is applied to the control gate electrode CG. At this time, the data read determination is performed depending on whether or not a current (reading current) flows between the pair of impurity regions IR.

<Method of Manufacturing Semiconductor Device>

Next, a method of manufacturing the semiconductor device according to the present embodiment will be described with reference to FIG. 16 to FIG. 23.

Figure 16:
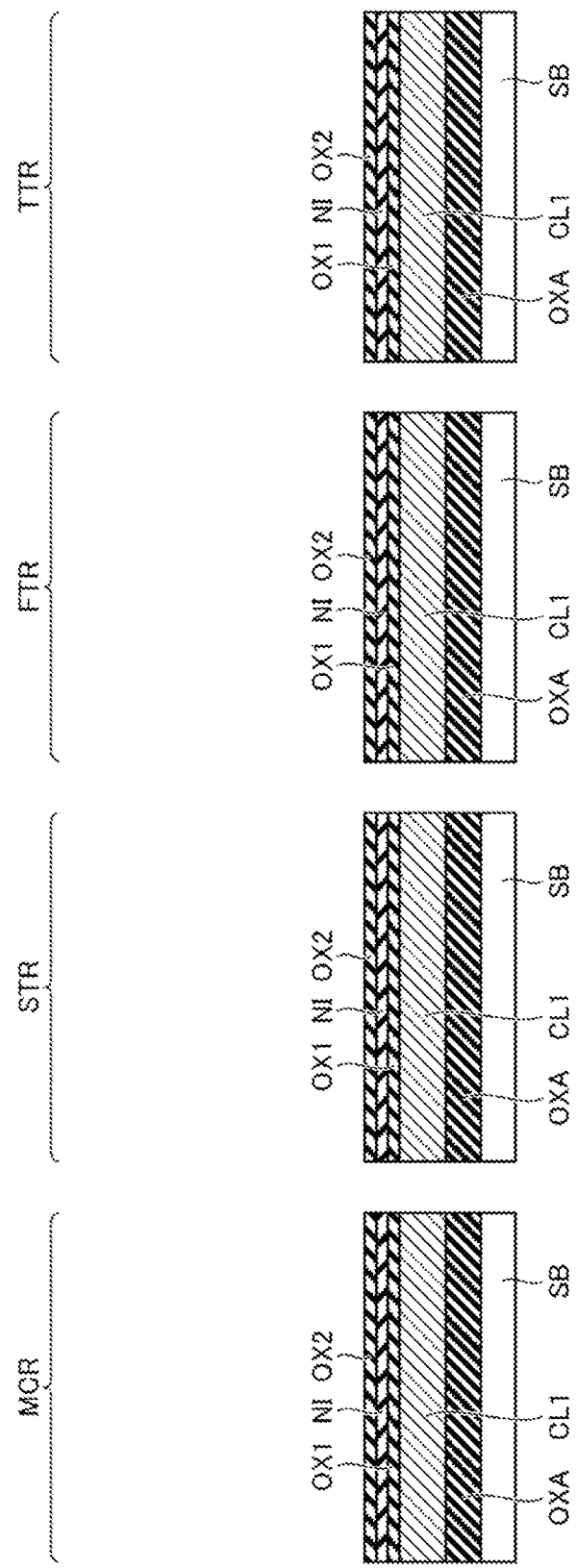
FIG. 16 is a cross-sectional view showing a first step of a method of manufacturing a semiconductor device according to the second embodiment.

As shown in FIG. 16, in the present embodiment, the semiconductor substrate SB is prepared and the STI and the well are formed in the semiconductor substrate SB, as in the first embodiment. Thereafter, the surface of the semiconductor substrate SB is thermally oxidized. As a result, in each of the memory region MCR and the transistor regions FTR, STR, and TTR, a silicon oxide film OXA made of a thermal oxide film is formed to have a thickness of, for example, 100 Å (angstrom) on the surface of the semiconductor substrate SB. The silicon oxide film OXA is an oxide film for forming the tunnel oxide film TI (oxide film for forming tunnel oxide film) in the non-volatile semiconductor memory MC.

In each of the memory region MCR and the transistor regions FTR, STR, and TTR, a conductive film CL1 is formed on a surface of the silicon oxide film OXA. The conductive film CL1 is a conductive film for forming the floating gate electrode FG (conductive film for forming floating gate electrode) in the non-volatile semiconductor memory MC. The conductive film CL1 is formed to have a thickness of, for example, 1000 Å (angstrom). The conductive film CL1 is made of, for example, doped polysilicon.

In each of the memory region MCR and the transistor regions FTR, STR, and TTR, the silicon oxide film OX1, the silicon nitride film NI, and the silicon oxide film OX2 are formed in this order on a surface of the conductive film CL1.

Figure 17:
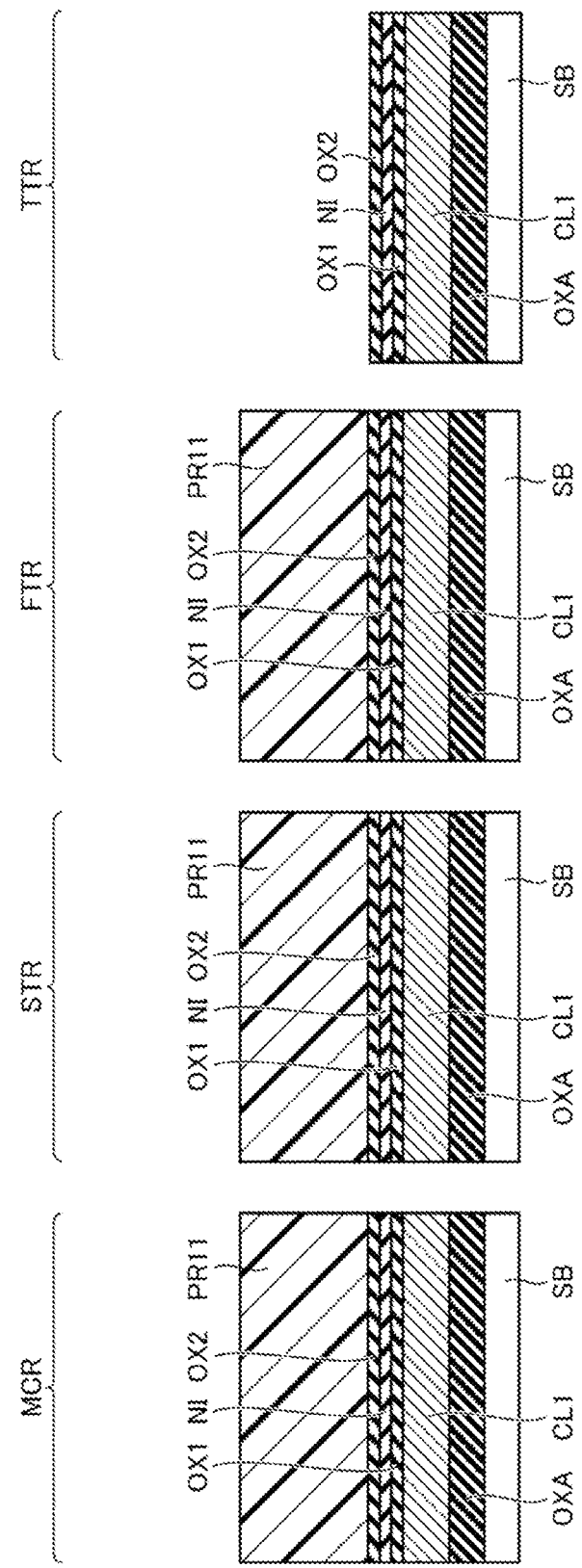
FIG. 17 is a cross-sectional view showing a second step of the method of manufacturing the semiconductor device according to the second embodiment.

As shown in FIG. 17, a photoresist PR11 is applied to the entire surface of the semiconductor substrate SB, and then selectively exposed and developed. As a result, a resist pattern PR11 covering each of the memory region MCR, the first transistor region FTR, and the second transistor region STR is formed.

Then, dry etching is performed using the resist pattern PR11 as a mask. By the dry etching, the silicon oxide film OX2, the silicon nitride film NI, and the silicon oxide film OX1 are sequentially removed in the third transistor region TTR. Thereafter, the conductive film CL1 is removed by dry etching. Then, the silicon oxide film OXA is removed by wet etching. As a result, the surface of the semiconductor substrate SB is exposed in the third transistor region TTR. Thereafter, the resist pattern PR1/ is peeled off and removed by acid.

Figure 18:
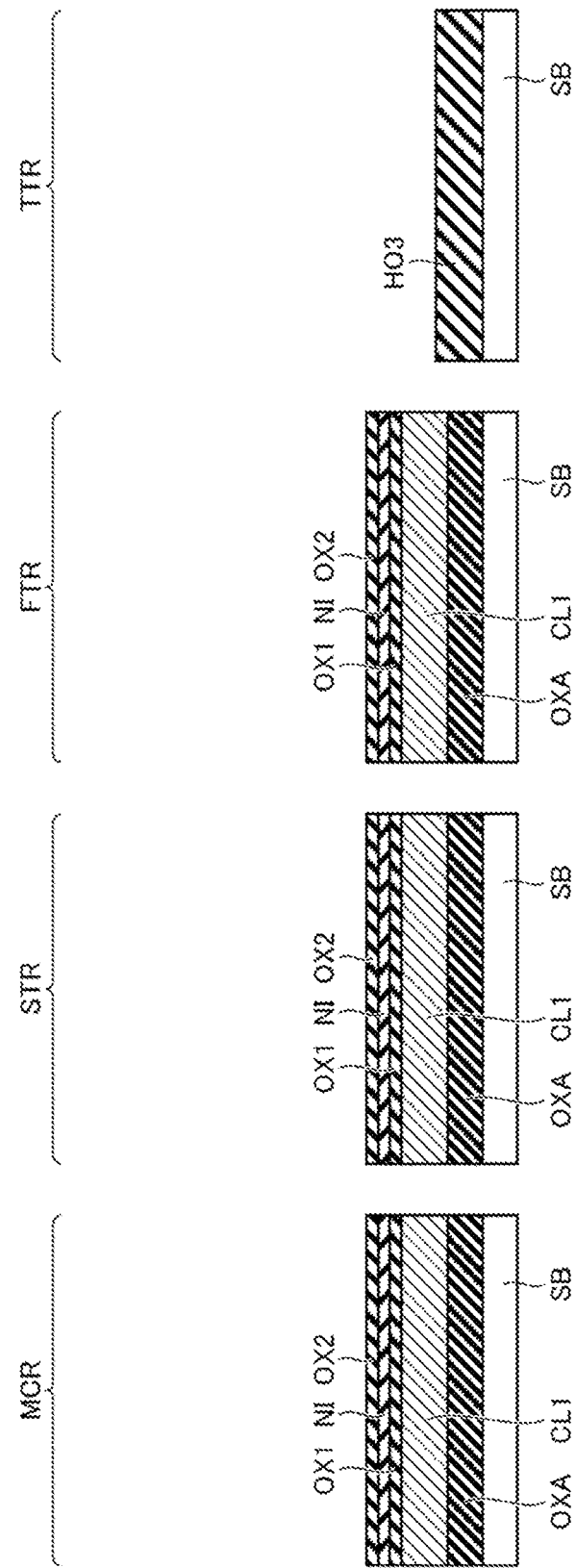
FIG. 18 is a cross-sectional view showing a third step of the method of manufacturing the semiconductor device according to the second embodiment.

As shown in FIG. 18, the surface of the semiconductor substrate SB is thermally oxidized. As a result, in the third transistor region TTR, a silicon oxide film HO3 made of a thermal oxide film is formed to have a thickness of, for example, 150 Å (angstrom) on the surface of the semiconductor substrate SB.

Figure 19:
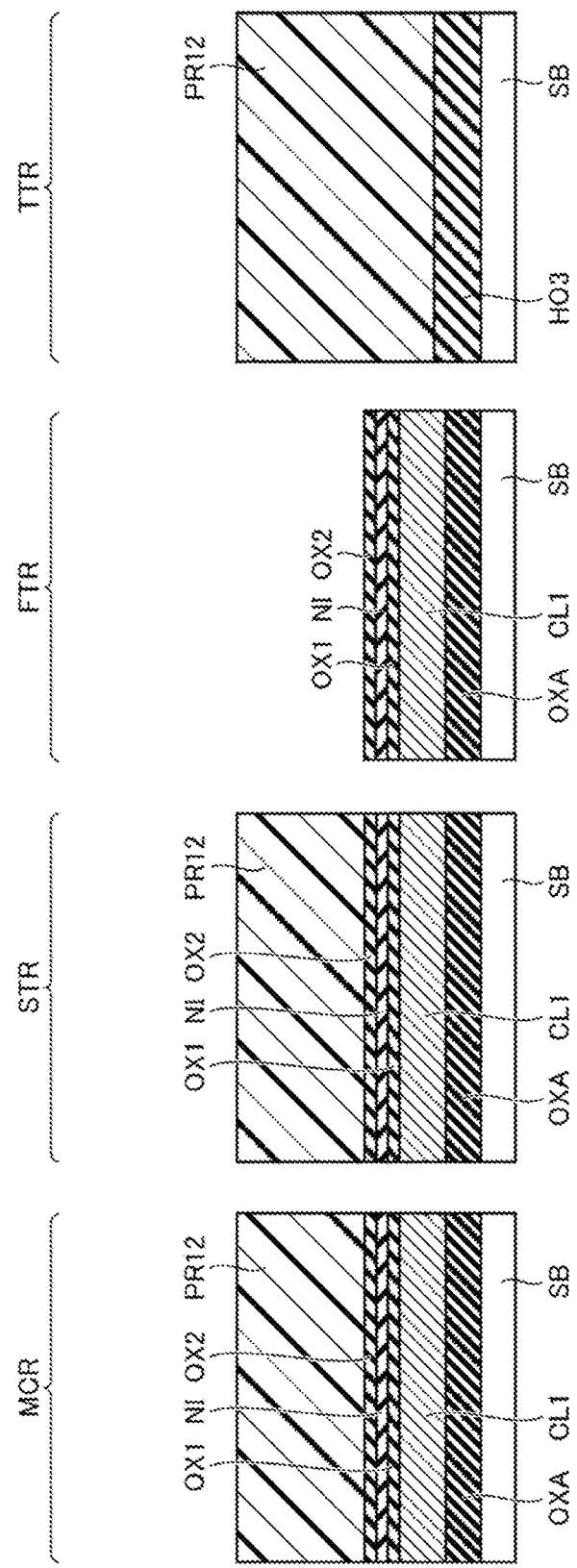
FIG. 19 is a cross-sectional view showing a fourth step of the method of manufacturing the semiconductor device according to the second embodiment.

As shown in FIG. 19, a photoresist PR12 is applied to the entire surface of the semiconductor substrate SB, and then selectively exposed and developed. As a result, a resist pattern PR12 covering each of the memory region MCR, the second transistor region STR, and the third transistor region TTR is formed.

Then, dry etching is performed using the resist pattern PR12 as a mask. By this dry etching, the silicon oxide film OX2, the silicon nitride film NI, and the silicon oxide film OX1 are sequentially removed in the first transistor region FTR, and the conductive film CL1 is exposed. Thereafter, dry etching is performed.

Figure 20:
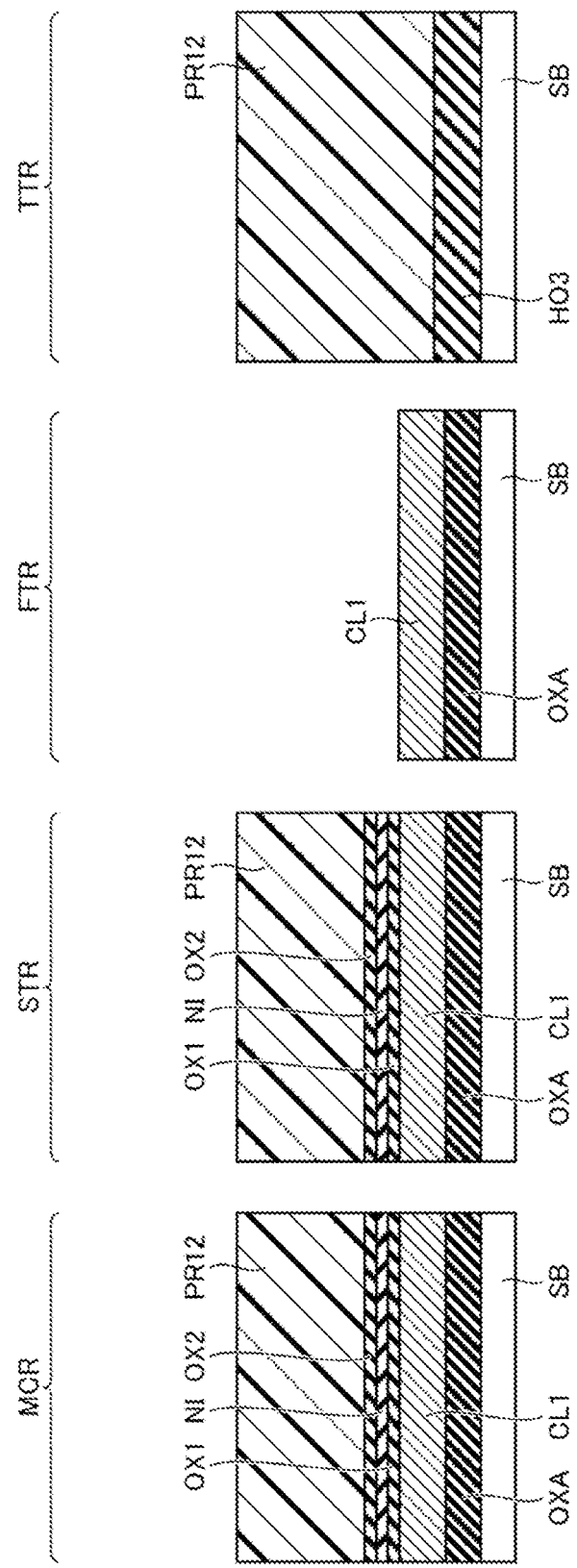
FIG. 20 is a cross-sectional view showing a fifth step of the method of manufacturing the semiconductor device according to the second embodiment.

As shown in FIG. 20, the above-mentioned dry etching is performed by, for example, the CDE. By this dry etching, the exposed conductive film CL1 is selectively removed in the first transistor region FTR, and the silicon oxide film OXA is exposed.

During the above-mentioned dry etching, a part of the upper layer of the exposed silicon oxide film OXA is also overetched and removed. By adjusting the overetching of the CDE, the thickness of the residual silicon oxide film OXA is adjusted to, for example, 75 Å (angstrom). Thereafter, the resist pattern PR12 is peeled off and removed by acid.

Figure 21:
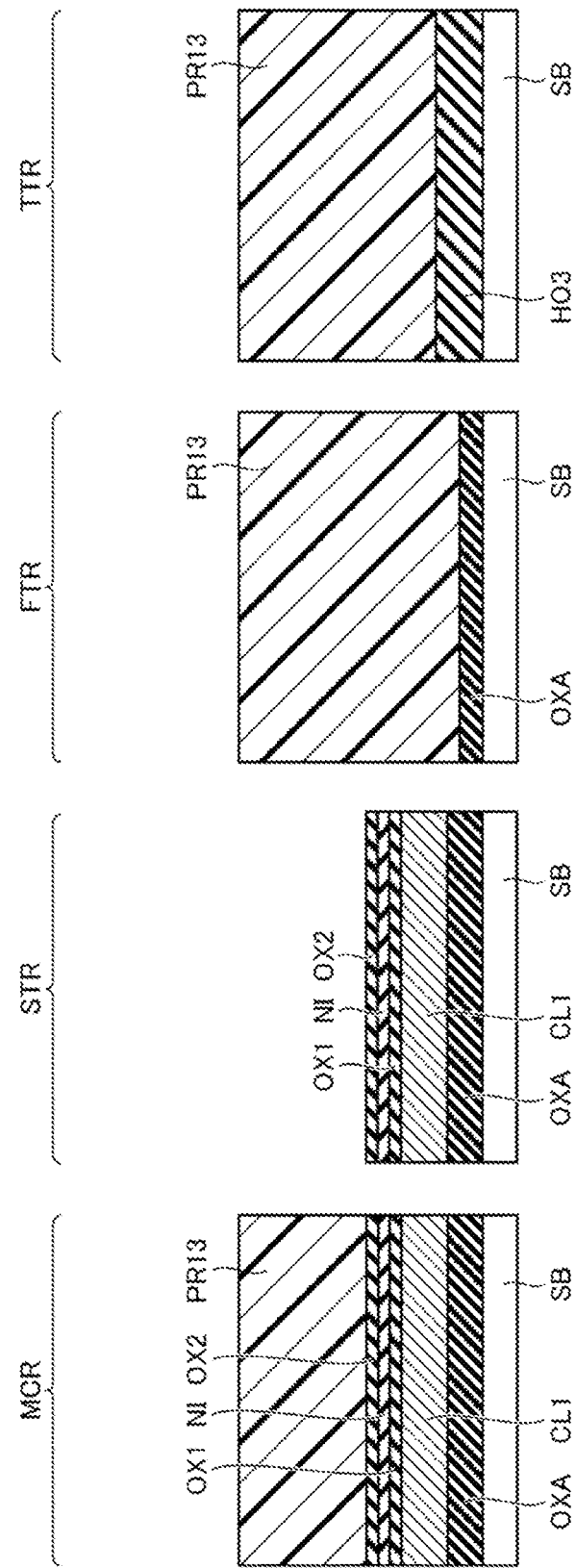
FIG. 21 is a cross-sectional view showing a sixth step of the method of manufacturing the semiconductor device according to the second embodiment.

As shown in FIG. 21, a photoresist PR13 is applied to the entire surface of the semiconductor substrate SB, and then selectively exposed and developed. As a result, a resist pattern PR13 covering each of the memory region MCR, the first transistor region FTR, and the third transistor region TTR is formed.

Then, dry etching is performed using the resist pattern PR13 as a mask. By this dry etching, the silicon oxide film OX2, the silicon nitride film NI, and the silicon oxide film OX1 are sequentially removed in the second transistor region STR. Thereafter, the conductive film CL1 is removed by dry etching. Then, the silicon oxide film OXA is removed by wet etching. As a result, the surface of the semiconductor substrate SB is exposed in the second transistor region STR. Thereafter, the resist pattern PR13 is peeled off and removed by acid.

Figure 22:
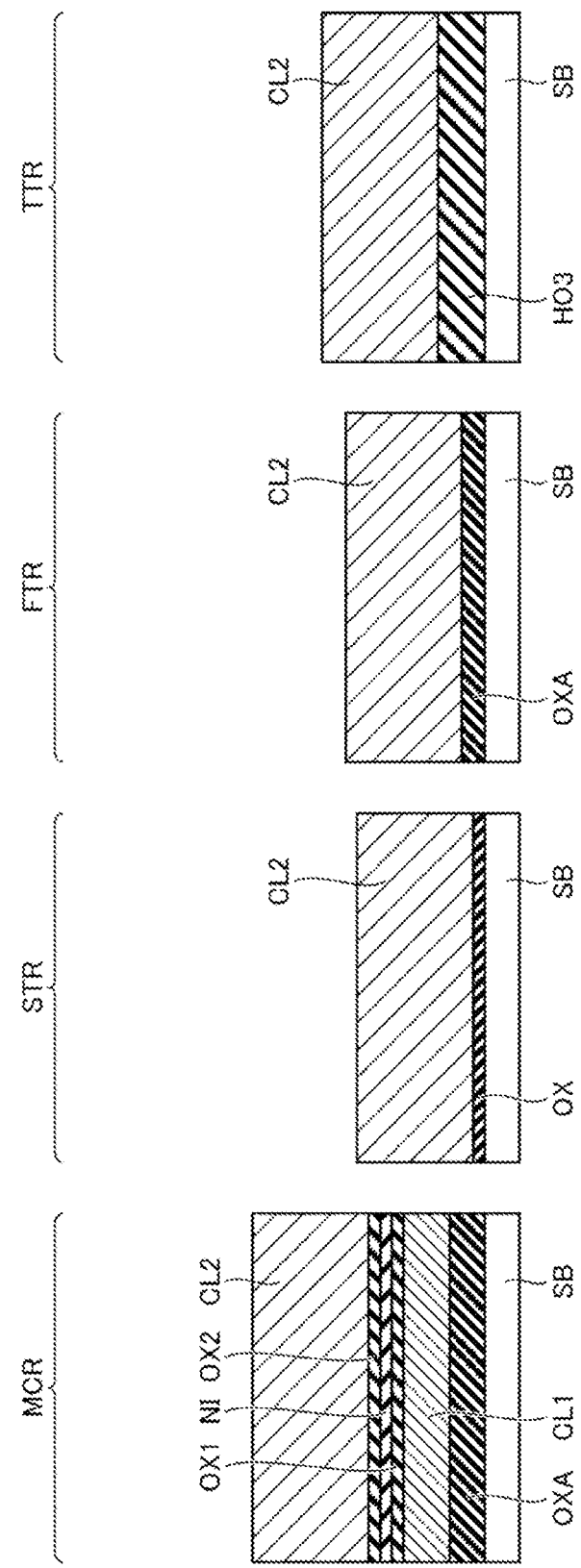
FIG. 22 is a cross-sectional view showing a seventh step of the method of manufacturing the semiconductor device according to the second embodiment.

As shown in FIG. 22, the surface of the semiconductor substrate SB is thermally oxidized. As a result, in the second transistor region STR, a silicon oxide film OX made of a thermal oxide film is formed to have a thickness of, for example, 27 Å (angstrom) on the surface of the semiconductor substrate SB.

Thereafter, a conductive film CL2 is formed in each of the memory region MCR and the transistor regions FTR, STR, and TTR. The conductive film CL2 is made of, for example, doped polysilicon.

Figure 23:
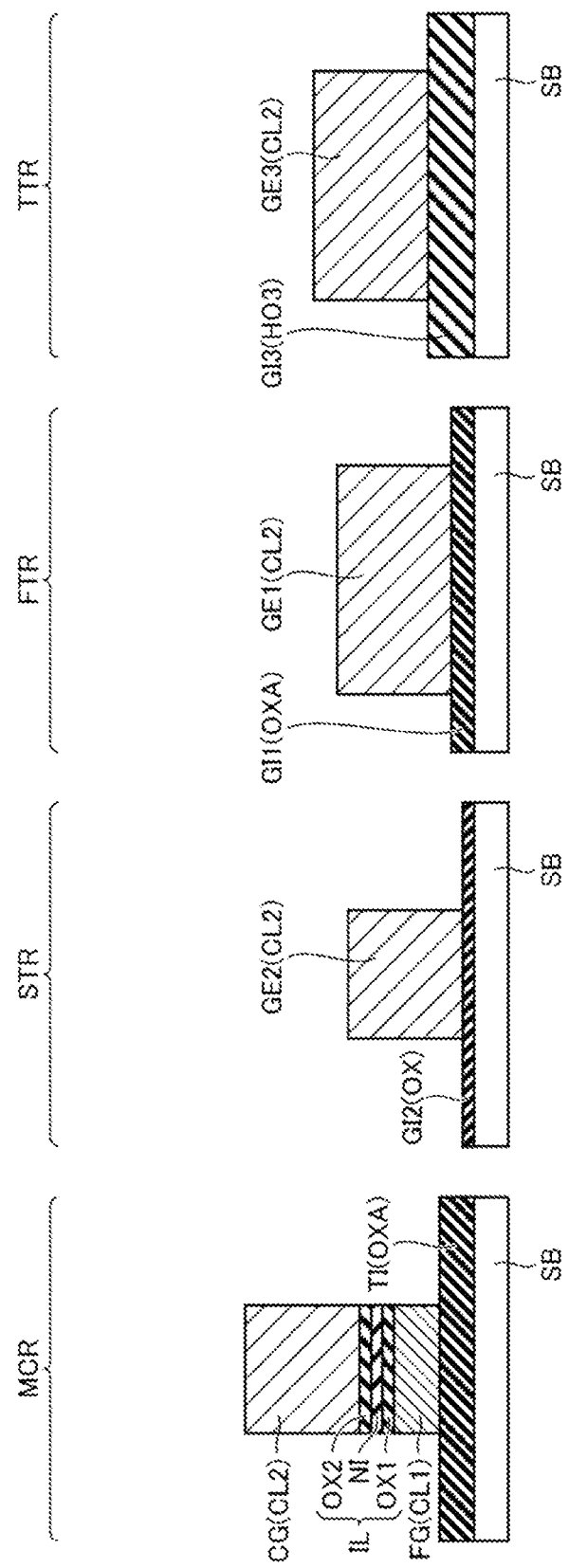
FIG. 23 is a cross-sectional view showing an eighth step of the method of manufacturing the semiconductor device according to the second embodiment.

As shown in FIG. 23, the conductive film CL2 is patterned by a photoengraving technique and an etching technique. As a result, in the memory region MCR, the control gate electrode CG is formed from the conductive film CL2. In the first transistor region FTR, the gate electrode GE1 is formed from the conductive film CL2. In the second transistor region STR, the gate electrode GE2 is formed from the conductive film CL2. In the third transistor region TTR, the gate electrode GE3 is formed from the conductive film CL2.

Also, in the memory region MCR, the silicon oxide film OX2, the silicon nitride film NI, the silicon oxide film OX1, the conductive film CL1, and the silicon oxide film OXA are selectively removed. As a result, the insulating film IL is formed from the silicon oxide film OX2, the silicon nitride film NI, and the silicon oxide film OX1. Further, the floating gate electrode FG is formed from the conductive film CL1.

Further, in the memory region MCR, the tunnel oxide film TI is formed from the silicon oxide film OXA. In the first transistor region FTR, the gate oxide film GI1 is formed from the silicon oxide film OXA. In the second transistor region STR, the gate oxide film GI2 is formed from the silicon oxide film OX. In the third transistor region TTR, the gate oxide film GI3 is formed from the silicon oxide film HO3.

Thereafter, the impurity regions IR, IR1, IR2, IR3, and the like constituting the source region and the drain region are formed, so that the semiconductor device according to the present embodiment shown in FIG. 14 is manufactured.

<Effect>

Next, the effects of the present embodiment will be described.

In the present embodiment, as shown in FIG. 16, the silicon oxide film OXA is formed on the surface of the semiconductor substrate SB, and the insulating films OX1, NI, and OX2 (first etched films) are formed on the silicon oxide film OXA in the first transistor region FTR. Thereafter, as shown in FIG. 19 and FIG. 20, the insulating films OX1, NI, and OX2 and a part of the upper layer of the silicon oxide film OXA are removed by etching in the first transistor region FTR. As a result, the gate oxide film GI1 of the first transistor FT is formed from the silicon oxide film OXA.

As described above, the thickness of the gate oxide film GI1 is adjusted by removing a part of the upper layer of the silicon oxide film OXA by etching. This makes it possible to adjust the film thickness of the gate oxide film GI1 separately from the gate oxide films GI2 and GI3 of the second transistor ST and the third transistor TT. Therefore, it is possible to form the gate oxide film GI1 without significantly affecting the formation of the gate oxide films GI2 and GI3 of the second transistor ST and the third transistor TT.

Also, according to the present embodiment, as shown in FIG. 19 and FIG. 20, the removal of the insulating films OX1, NI, and OX2 and the removal of a part of the upper layer of the silicon oxide film OXA are each performed by dry etching. Therefore, it is possible to easily control the thickness of the residual silicon oxide film OXA by the dry etching.

Further, according to the present embodiment, the same effects as those of the first embodiment can be obtained in addition to those described above.

Third Embodiment

<Configuration of Semiconductor Device>

A configuration of a semiconductor device according to the third embodiment will be described with reference to FIG. 24 and FIG. 25.

Figure 24:
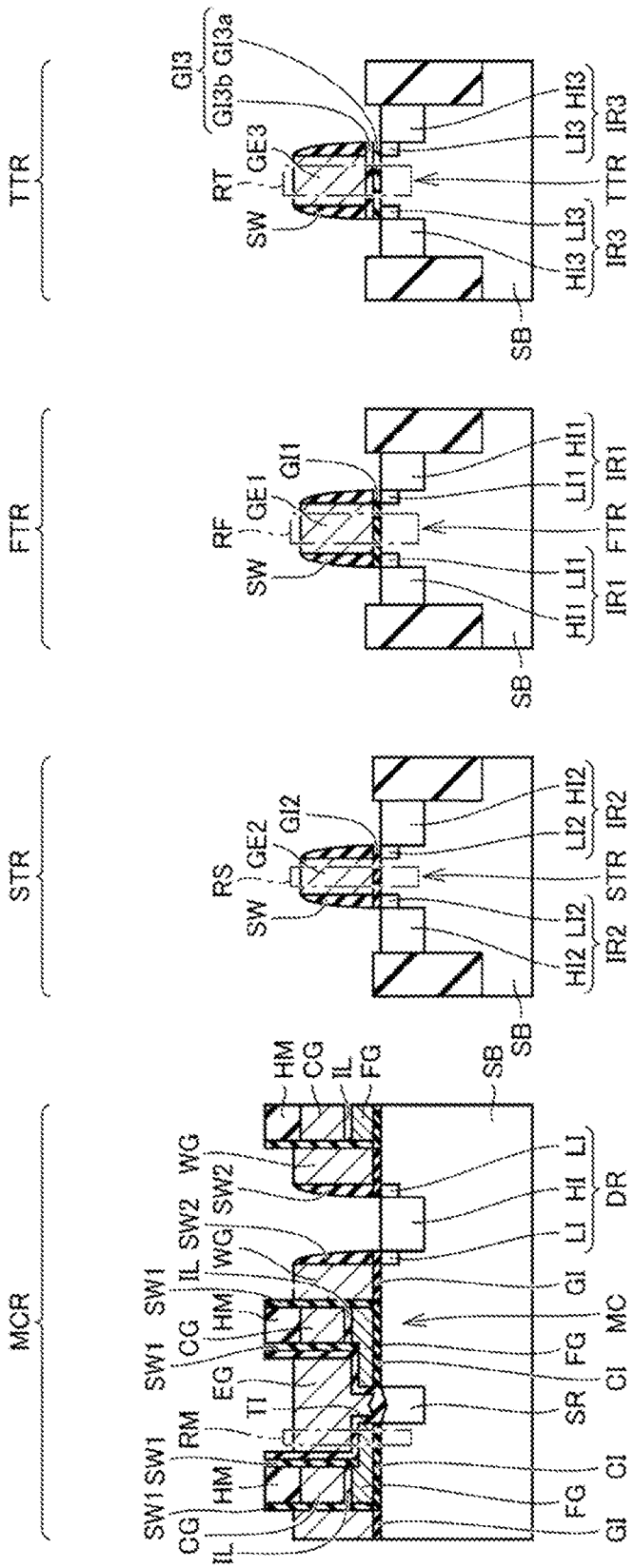
FIG. 24 is a cross-sectional view showing a configuration of a semiconductor device according to the third embodiment.
Figure 25:
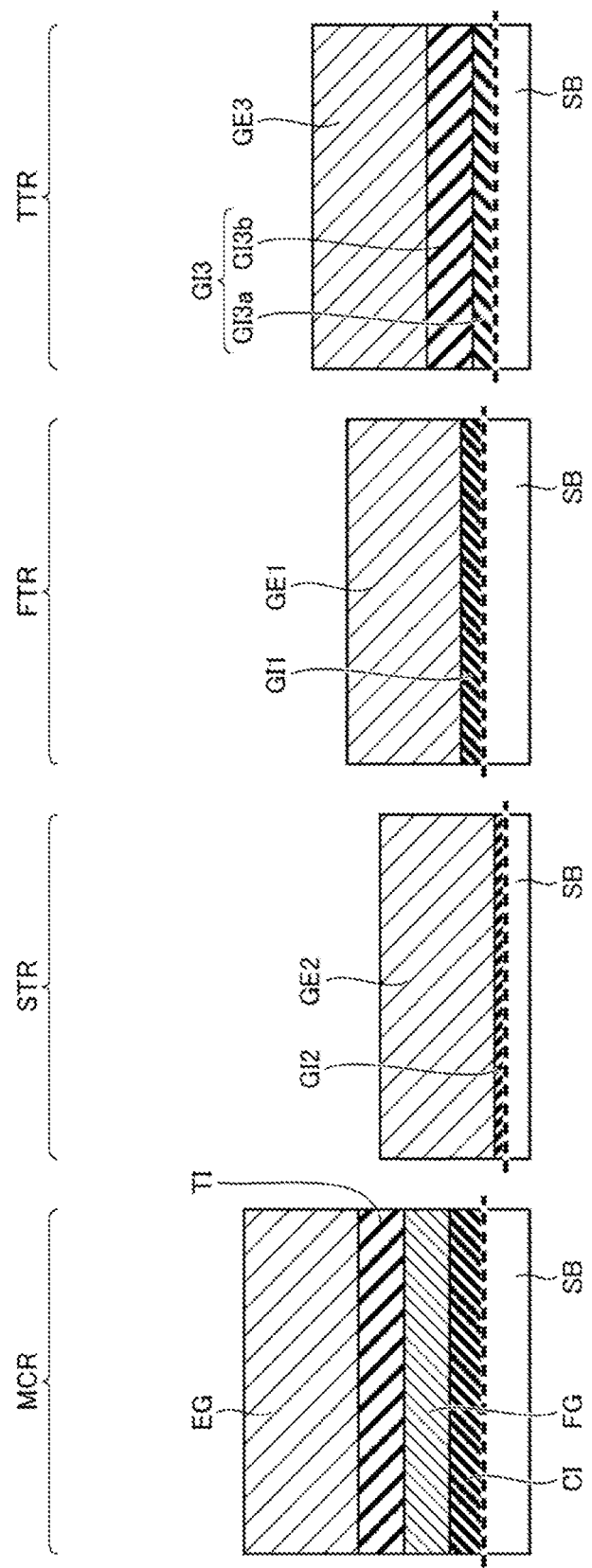
FIG. 25 is a partially enlarged cross-sectional view showing regions RM, RF, RS, and RT of FIG. 24 in an enlarged manner.

As shown in FIG. 24 and FIG. 25, the configuration of the semiconductor device according to the present embodiment is different from that of the first embodiment in the configuration of the non-volatile semiconductor memory MC. In the present embodiment, the non-volatile semiconductor memory MC is, for example, a split gate flash memory having an erasing gate electrode EG and a selection gate electrode WG.

The non-volatile semiconductor memory MC includes a source region SR, a drain region DR, a coupling oxide film CI, a floating gate electrode FG, an insulating film IL, a control gate electrode CG, and an insulating film HM. The non-volatile semiconductor memory MC further includes a tunnel oxide film TI, the erasing gate electrode EG, a gate oxide film GI, and the selection gate electrode WG.

The source region SR and the drain region DR are arranged in a surface of a semiconductor substrate SB at a distance from each other. The semiconductor substrate SB is made of, for example, single crystal silicon. Each of the source region SR and the drain region DR is configured by introducing, for example, an n-type impurity into the surface of the semiconductor substrate SB.

The drain region DR has a high concentration region HI and a low concentration region LI, and may have an LDD structure. The high concentration region HI has an n-type impurity concentration higher than that of the low concentration region LI.

The floating gate electrode FG is arranged on the surface of the semiconductor substrate SB sandwiched between the source region SR and the drain region DR with the coupling oxide film CI interposed therebetween. The coupling oxide film CI is, for example, a silicon oxide film formed by thermally oxidizing the surface of the semiconductor substrate SB made of silicon. The coupling oxide film CI has a thickness of, for example, 100 Å (angstrom).

The floating gate electrode FG is made of, for example, doped polysilicon. The floating gate electrode FG has a thickness of, for example, 280 Å (angstrom). The control gate electrode CG is arranged on the floating gate electrode FG with the insulating film IL interposed therebetween. The insulating film HM that functions as a hard mask in the manufacturing process is arranged on the control gate electrode CG.

A side wall of the floating gate electrode FG on a side closer to the source region SR protrudes toward the source region SR as compared with a side wall of the control gate electrode CG on the side closer to the source region SR. Side walls of the floating gate electrode FG and the control gate electrode CG on a side closer to the drain region DR and a side wall of the control gate electrode CG on the side closer to the source region SR are covered with sidewall insulating films SW1.

The erasing gate electrode EG is arranged on the surface of the semiconductor substrate SB with the tunnel oxide film TI interposed therebetween. The erasing gate electrode EG faces the side surface of the floating gate electrode FG on the side closer to the source region SR and the upper surface of the floating gate electrode FG with the tunnel oxide film TI interposed therebetween. The erasing gate electrode EG faces the side surface of the control gate electrode CG on the side closer to the source region SR with the sidewall insulating film SW and the tunnel oxide film TI interposed therebetween.

The selection gate electrode WG is arranged on the surface of the semiconductor substrate SB with the gate oxide film GI interposed therebetween. The selection gate electrode WG faces the side surfaces of the floating gate electrode FG and the control gate electrode CG on the side closer to the drain region DR with the sidewall insulating film SW1 interposed therebetween. The side surface of the selection gate electrode WG on the side closer to the drain region DR is covered with a sidewall insulating film SW2.

Since the configurations in the present embodiment other than those described above are almost the same as the configurations in the first embodiment, the same elements are denoted by the same reference characters and the description thereof will not be repeated.

<Operation of Non-Volatile Semiconductor Memory MC>

Next, an operation of the non-volatile semiconductor memory MC shown in FIG. 24 will be described.

As shown in FIG. 24, when writing data, predetermined voltages are applied to the source region SR, the control gate electrode CC, the selection gate electrode WG, and the drain region DR, respectively. As a result, electrons are injected from the drain region DR into the floating gate electrode FG. In this way, data is written.

When erasing data, the erasing gate electrode EG is made to have a high potential. As a result, the electrons accumulated in the floating gate electrode FG are extracted to the erasing gate electrode EG through the tunnel oxide film TI. In this way, data is erased.

When reading data, predetermined voltages are applied to the control gate electrode CG, the selection gate electrode WG, and the drain region DR, respectively. In this way, data is read out depending on whether or not a current (reading current) flows between the drain region DR and the source region SR.

<Method of Manufacturing Semiconductor Device>

Next, a method of manufacturing the semiconductor device according to the present embodiment will be described with reference to FIG. 26 to FIG. 36.

Figure 26:
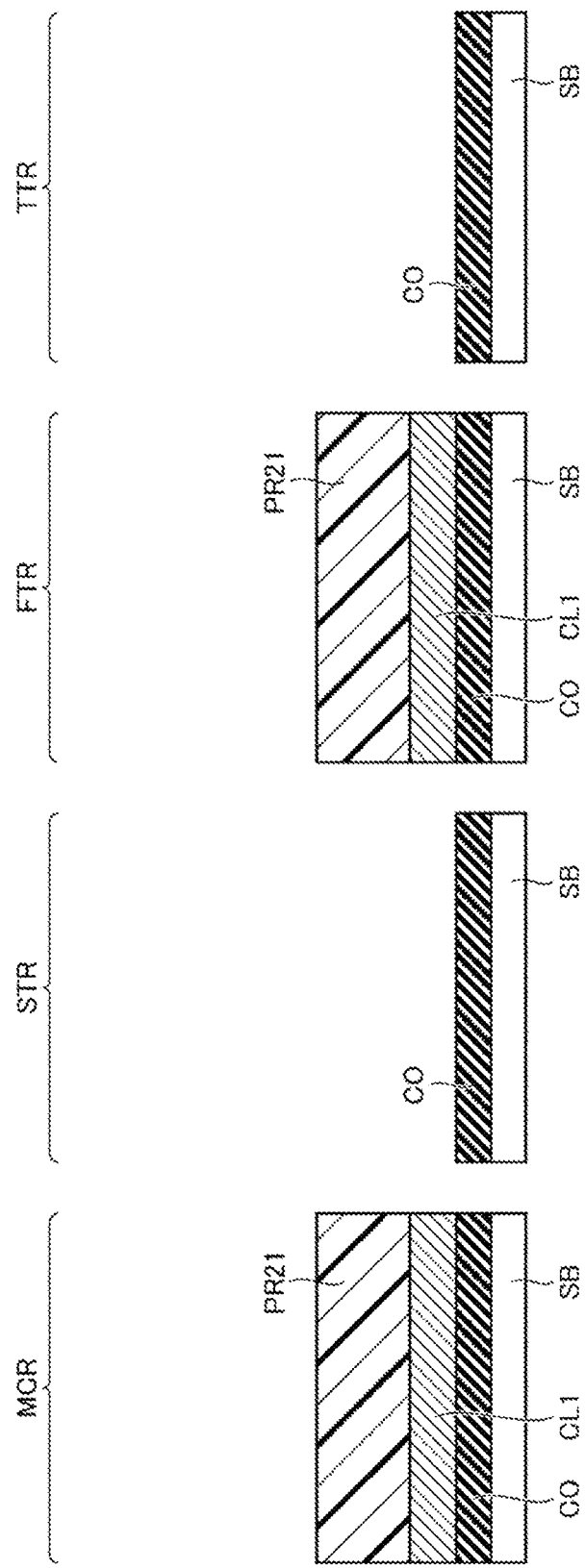
FIG. 26 is a cross-sectional view showing a first step of a method of manufacturing a semiconductor device according to the third embodiment.

As shown in FIG. 26, in the present embodiment, the semiconductor substrate SB is prepared and the STI and the well are formed in the semiconductor substrate SB, as in the first embodiment. Thereafter, the surface of the semiconductor substrate SB is thermally oxidized. As a result, in each of the memory region MCR and the transistor regions FTR, STR, and TTR, a silicon oxide film CO made of a thermal oxide film is formed to have a thickness of, for example, 100 Å (angstrom) on the surface of the semiconductor substrate SB. The silicon oxide film CO is an oxide film for forming the coupling oxide film CI (oxide film for forming coupling oxide film) in the non-volatile semiconductor memory MC.

In each of the memory region MCR and the transistor regions FTR, STR, and TTR, a conductive film CL1 is formed on a surface of the silicon oxide film CO. The conductive film CL1 is a conductive film for forming the floating gate electrode FG (conductive film for forming floating gate electrode) in the non-volatile semiconductor memory MC. The conductive film CL1 is formed to have a thickness of, for example, 280 Å (angstrom).

The conductive film CL1 is made of, for example, doped polysilicon.

Thereafter, a photoresist PR21 is applied to the entire surface of the semiconductor substrate SB, and then selectively exposed and developed. As a result, a resist pattern PR21 covering each of the memory region MCR and the first transistor region FTR is formed.

Then, dry etching is performed using the resist pattern PR21 as a mask. By the dry etching, the conductive film CL1 is removed in the second transistor region STR and the third transistor region TTR, and a surface of the silicon oxide film CO is exposed. Thereafter, the resist pattern PR21 is peeled off and removed by acid.

Figure 27:
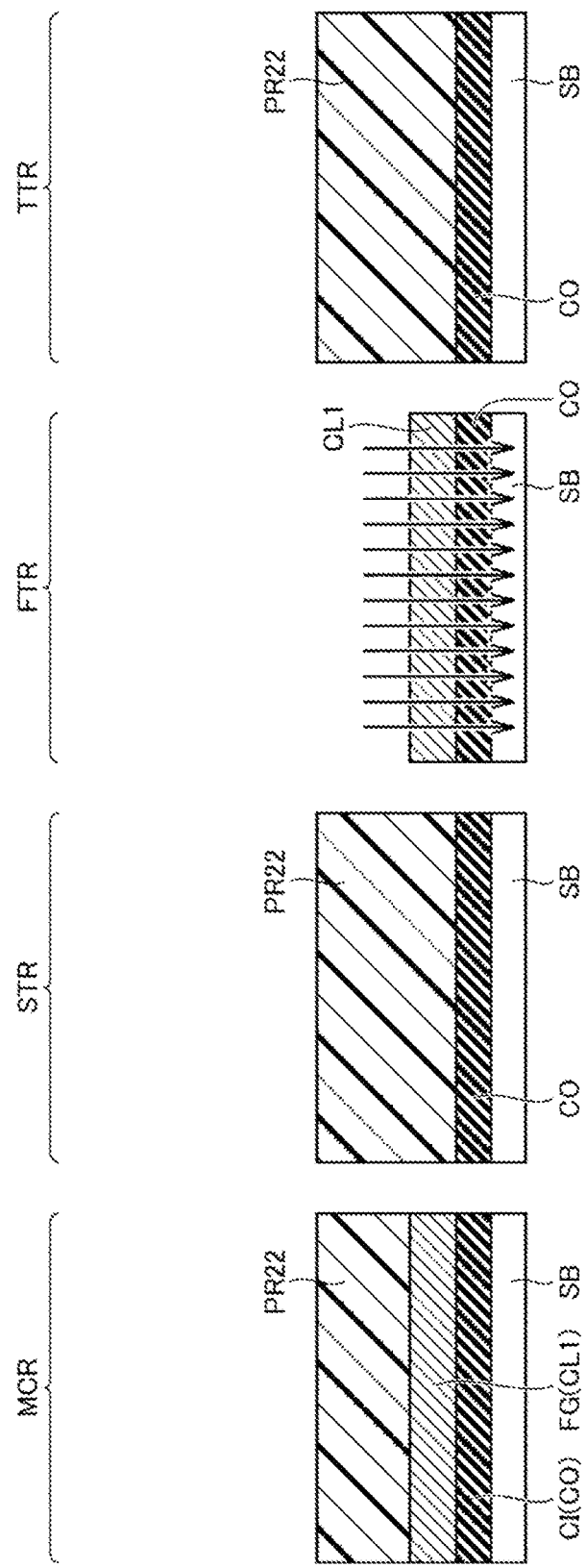
FIG. 27 is a cross-sectional view showing a second step of the method of manufacturing the semiconductor device according to the third embodiment.

As shown in FIG. 27, a photoresist PR22 is applied to the entire surface of the semiconductor substrate SB, and then selectively exposed and developed. As a result, a resist pattern PR22 covering each of the memory region MCR, the second transistor region STR, and the third transistor region TTR is formed.

An impurity is injected into the semiconductor substrate SB by using the resist pattern PR22 as a mask through the conductive film CL1 and the silicon oxide film CO in the first transistor region FTR. As a result, a well region is formed in the semiconductor substrate SB. Thereafter, the resist pattern PR22 is peeled off and removed by acid.

Then, although not shown in the drawing, the conductive film CL1 is selectively removed in the memory region MCR, so that the floating gate electrode FO is formed from the conductive film CL1. Also, the coupling oxide film CI is formed from the silicon oxide film CO located directly below the floating gate electrode FG. Further, the source region SR (FIG. 24) is formed in the surface of the semiconductor substrate SB by ion implantation or the like.

Figure 28:
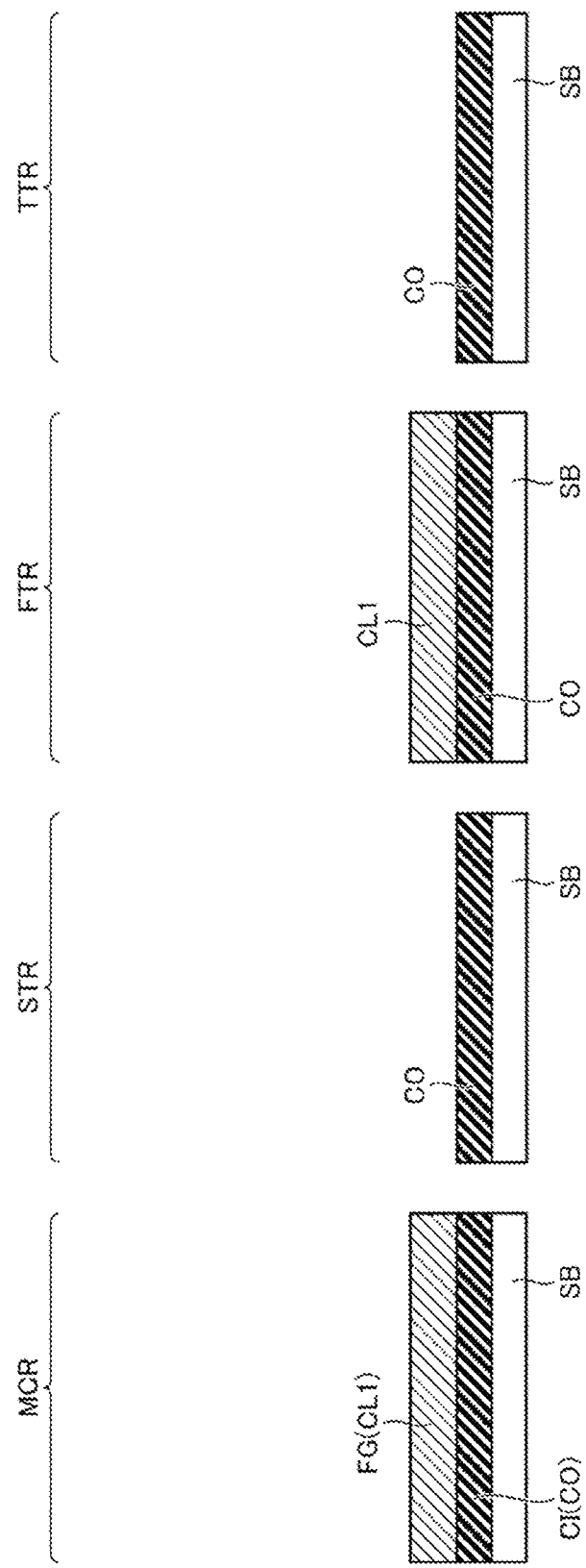
FIG. 28 is a cross-sectional view showing a third step of the method of manufacturing the semiconductor device according to the third embodiment.

As shown in FIG. 28, the silicon oxide film CO exposed in the second transistor region STR and the third transistor region TTR is removed by etching. As a result, the surface of the semiconductor substrate SB is exposed in the second transistor region STR and the third transistor region TTR.

Figure 29:
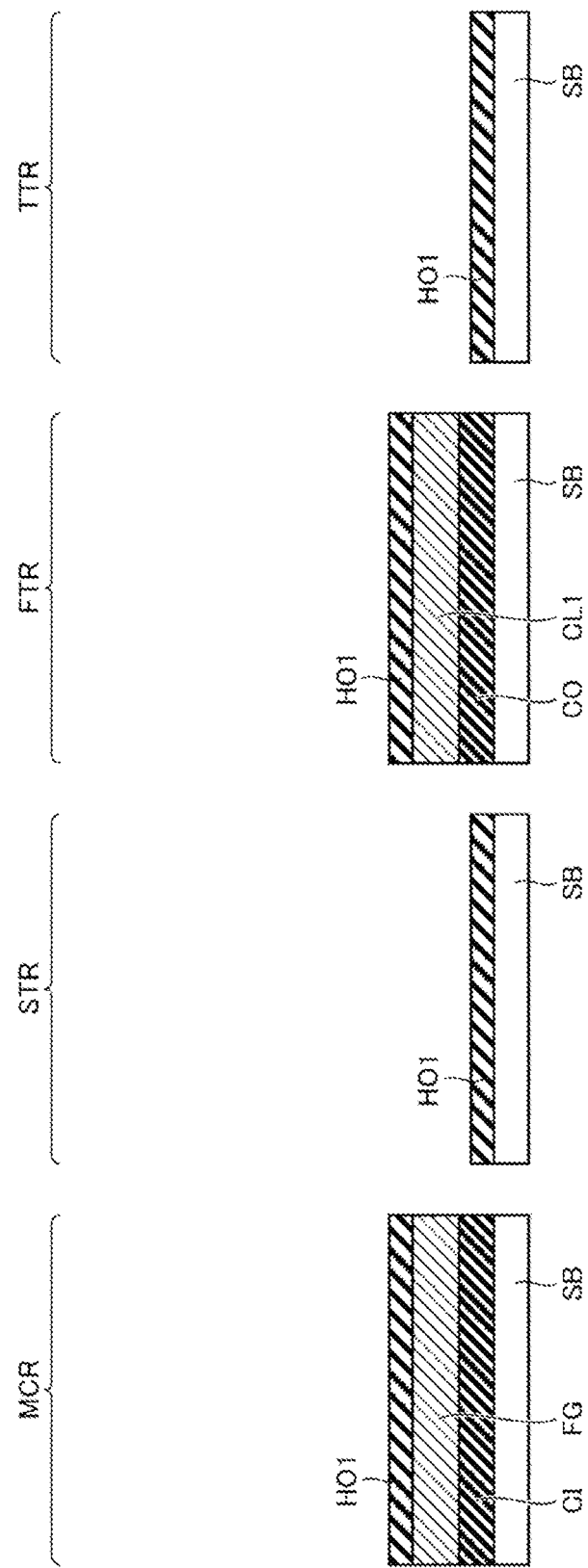
FIG. 29 is a cross-sectional view showing a fourth step of the method of manufacturing the semiconductor device according to the third embodiment.

As shown in FIG. 29, thermal oxidation is performed by the RTO on the entire surface of the semiconductor substrate SB. As a result, a silicon oxide film by the thermal oxidation is formed in each of the memory region MCR and the transistor regions FTR, STR, and TTR. Further, a silicon oxide film is deposited on the entire surface of the semiconductor substrate SB by the HTO. Consequently, a silicon oxide film HO1 having a stacked structure of the silicon oxide film formed by the RTO and the silicon oxide film formed by the HTO is formed in each of the memory region MCR and the transistor regions FTR, STR, and TTR. The silicon oxide film HO1 is formed to have a thickness of, for example, 48 Å (angstrom).

Figure 30:
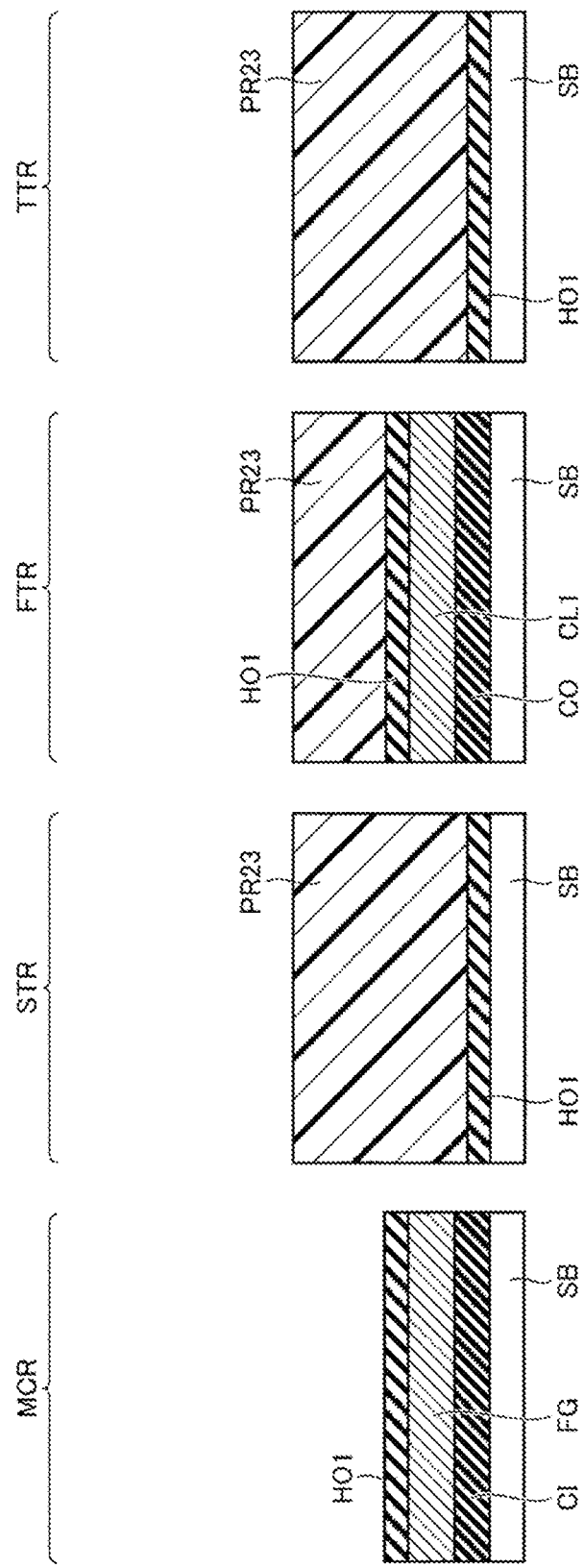
FIG. 30 is a cross-sectional view showing a fifth step of the method of manufacturing the semiconductor device according to the third embodiment.

As shown in FIG. 30, a photoresist PR23 is applied to the entire surface of the semiconductor substrate SB, and then selectively exposed and developed. As a result, a resist pattern PR23 covering each of the transistor regions FTR, STR, and TTR is formed.

Then, wet etching is performed using the resist pattern PR23 as a mask. By this wet etching, the silicon oxide film HO1 is selectively removed in the memory region MCR, and the floating gate electrode FG is exposed. Thereafter, the resist pattern PR23 is peeled off and removed by acid.

Figure 31:
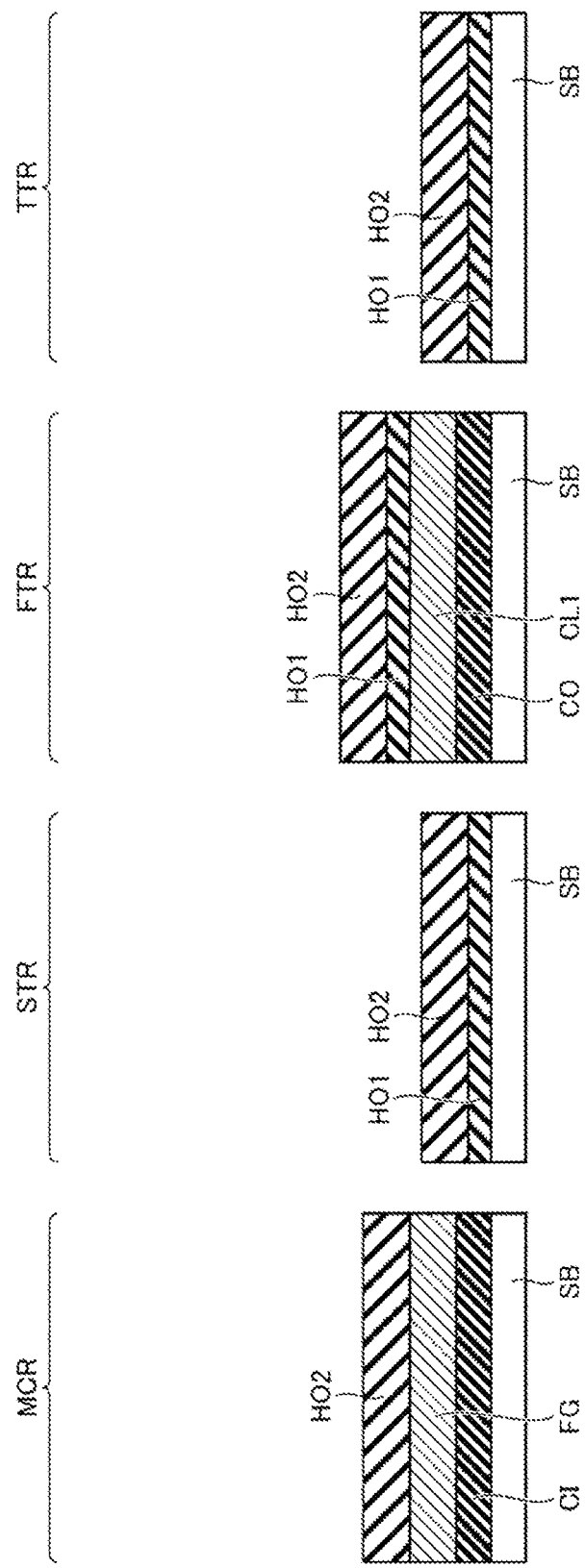
FIG. 31 is a cross-sectional view showing a sixth step of the method of manufacturing the semiconductor device according to the third embodiment.

As shown in FIG. 31, a silicon oxide film HO2 is deposited on the entire surface of the semiconductor substrate SB by the HTO. The silicon oxide film HO2 is formed to have a thickness of, for example, 139 Å (angstrom).

Figure 32:
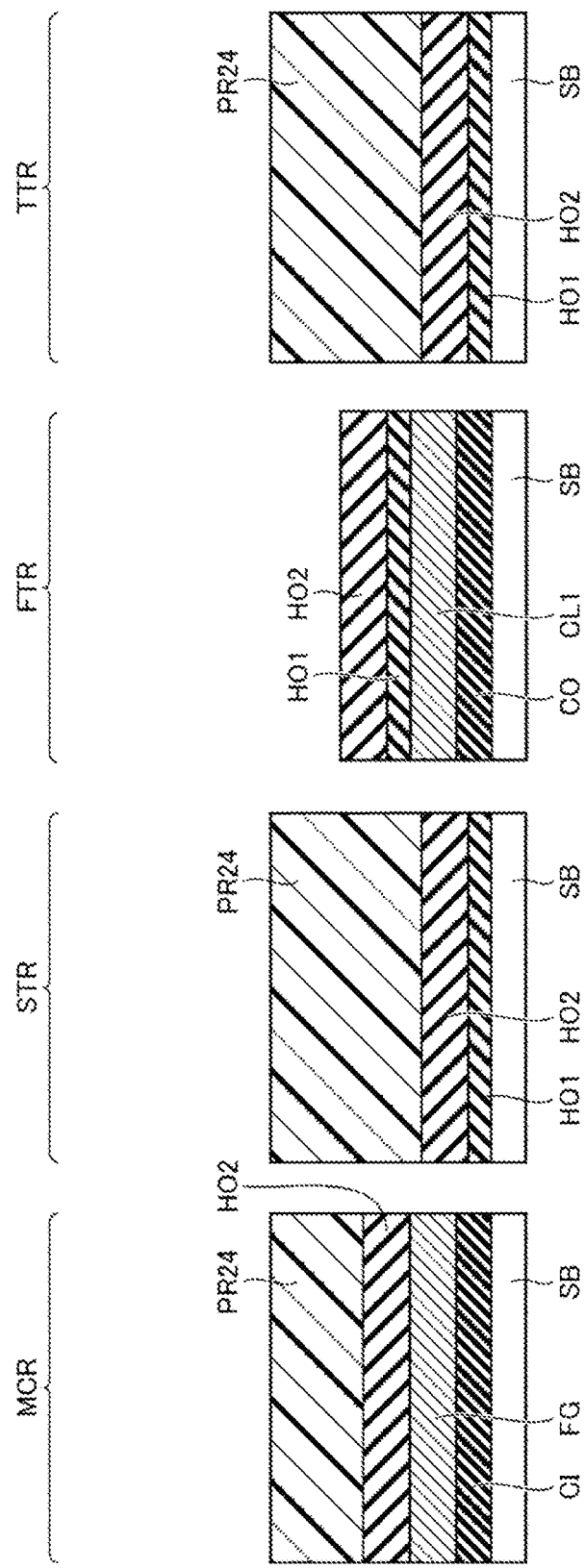
FIG. 32 is a cross-sectional view showing a seventh step of the method of manufacturing the semiconductor device according to the third embodiment.

As shown in FIG. 32, a photoresist PR24 is applied to the entire surface of the semiconductor substrate SB, and then selectively exposed and developed. As a result, a resist pattern PR24 covering each of the memory region MCR, the second transistor region STR, and the third transistor region TTR is formed.

Then, wet etching is performed using the resist pattern PR24 as a mask. By this wet etching, the silicon oxide films HO2 and HO1 are selectively removed in the first transistor region FTR, and the conductive film CL1 is exposed. Thereafter, dry etching is performed.

This dry etching is performed by, for example, the CDE. By this dry etching, the exposed conductive film CL1 is selectively removed, and the silicon oxide film CO is exposed.

Figure 33:
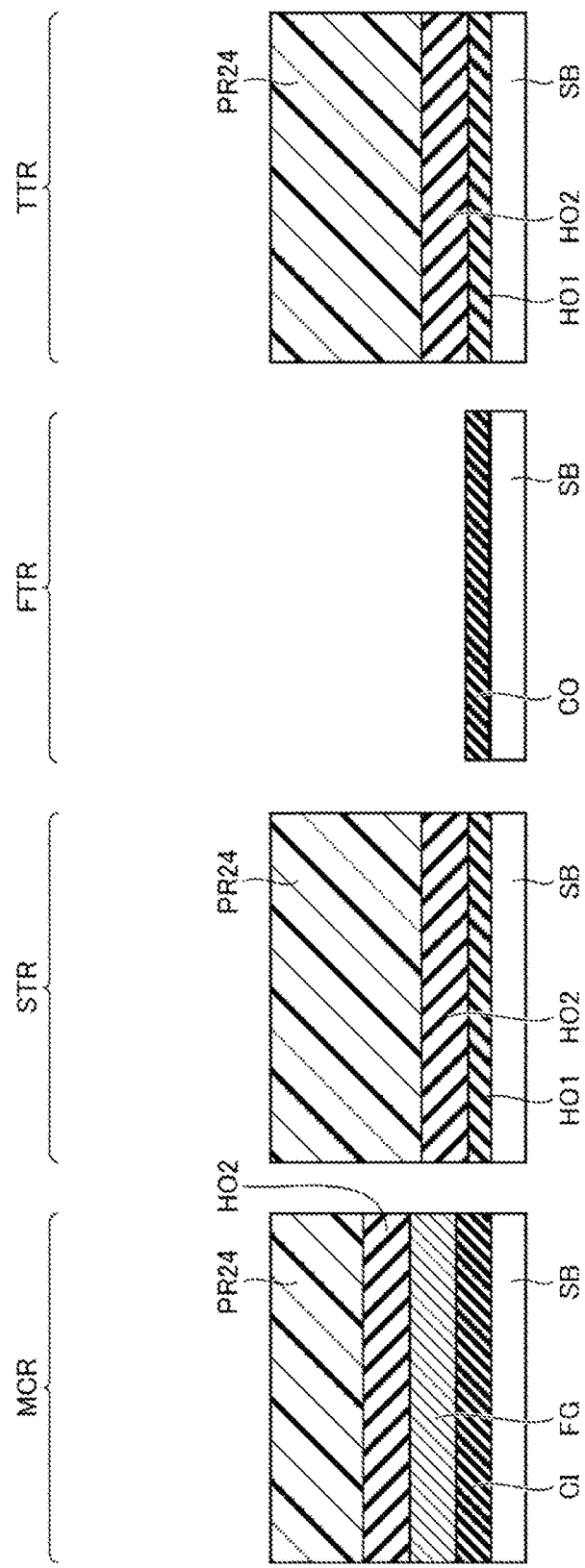
FIG. 33 is a cross-sectional view showing an eighth step of the method of manufacturing the semiconductor device according to the third embodiment.

As shown in FIG. 33, during the above-mentioned dry etching, a part of the upper layer of the exposed silicon oxide film CO is also overetched and removed. By adjusting the overetching of the CDE, the thickness of the residual silicon oxide film CO is adjusted to, for example, 75 Å (angstrom). Thereafter, the resist pattern PR24 is peeled off and removed by acid.

Figure 34:
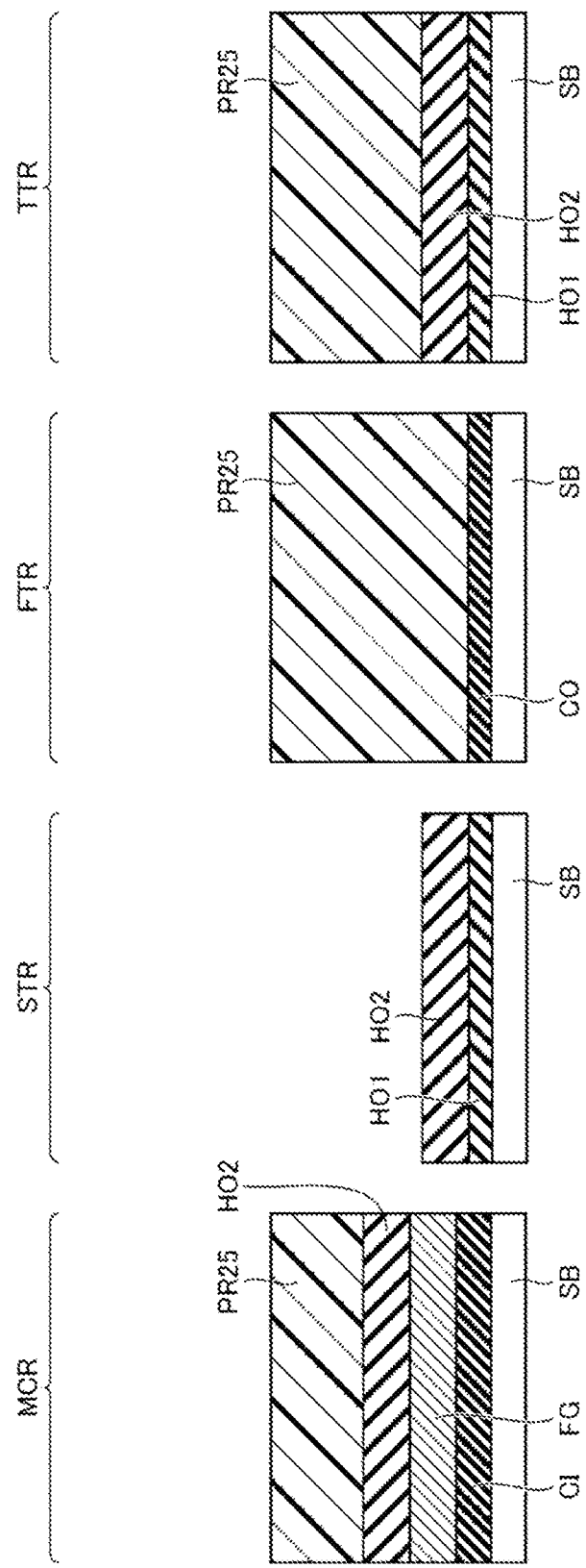
FIG. 34 is a cross-sectional view showing a ninth step of the method of manufacturing the semiconductor device according to the third embodiment.

As shown in FIG. 34, a photoresist PR25 is applied to the entire surface of the semiconductor substrate SB, and then selectively exposed and developed. As a result, a resist pattern PR25 covering each of the memory region MCR, the first transistor region FTR, and the third transistor region TTR is formed.

Then, wet etching is performed using the resist pattern PR25 as a mask. By this wet etching, the silicon oxide films HO2 and HO1 are selectively removed in the second transistor region STR, and the surface of the semiconductor substrate SB is exposed. Thereafter, the resist pattern PR25 is peeled off and removed by acid.

Figure 35:
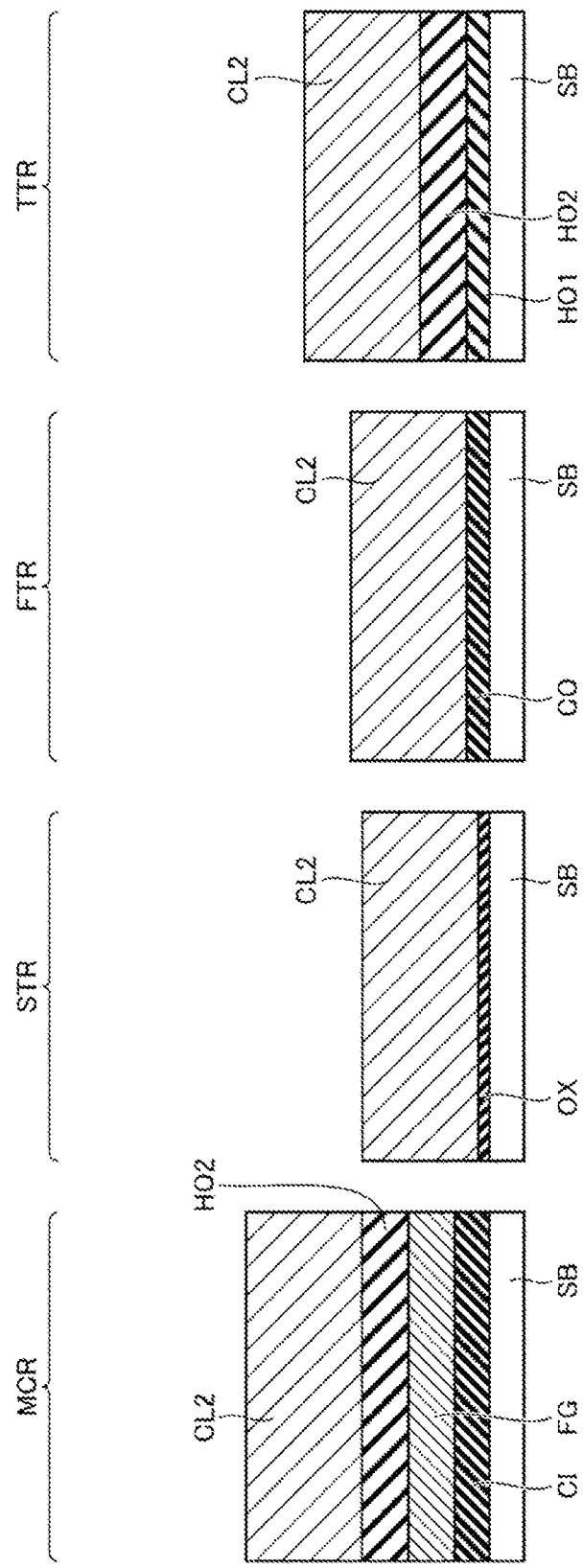
FIG. 35 is a cross-sectional view showing a tenth step of the method of manufacturing the semiconductor device according to the third embodiment.

As shown in FIG. 35, the surface of the semiconductor substrate SB is thermally oxidized. As a result, in the second transistor region STR, a silicon oxide film OX made of a thermal oxide film is formed to have a thickness of, for example, 27 Å (angstrom) on the surface of the semiconductor substrate SB.

Thereafter, a conductive film CL2 is formed in each of the memory region MCR and the transistor regions FTR, STR, and TTR. The conductive film CL2 is made of, for example, doped polysilicon.

Figure 36:
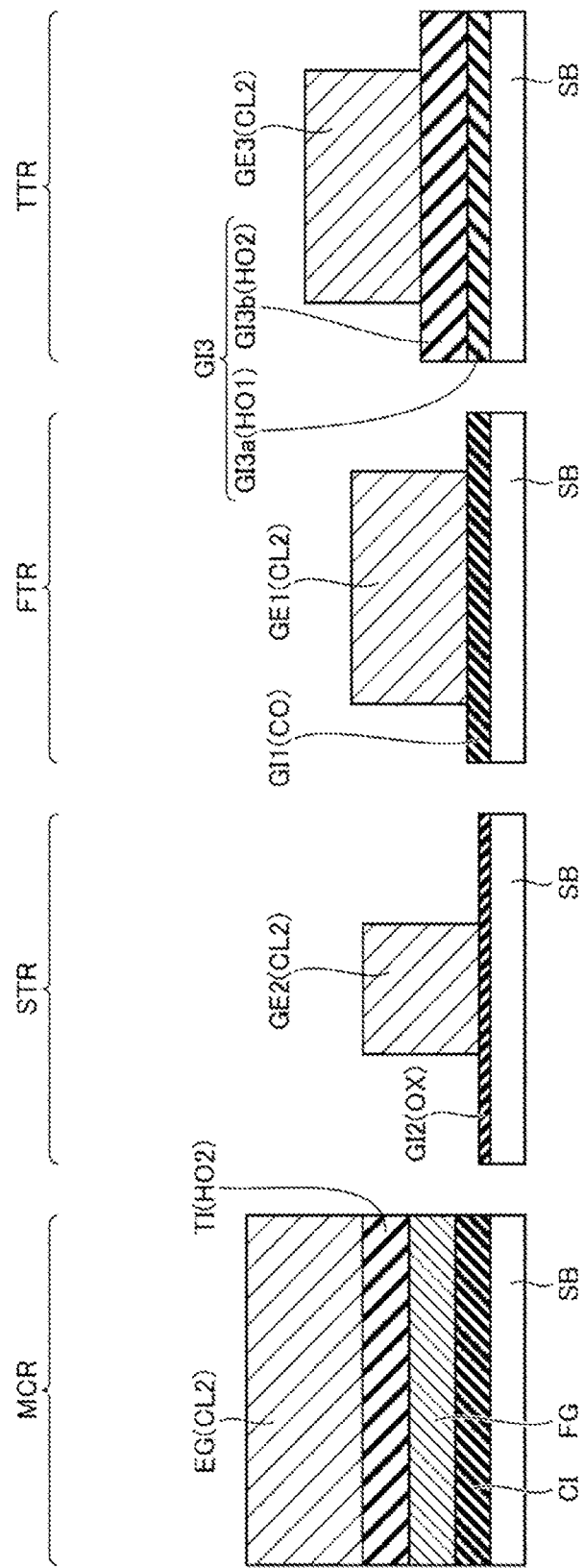
FIG. 36 is a cross-sectional view showing an eleventh step of the method of manufacturing the semiconductor device according to the third embodiment.

As shown in FIG. 36, the conductive film CL2 is patterned by a photoengraving technique and an etching technique. As a result, in the memory region MCR, the erasing gate electrode EG is formed from the conductive film CL2. In the first transistor region FTR, the gate electrode GE1 is formed from the conductive film CL2. In the second transistor region STR, the gate electrode GE2 is formed from the conductive film CL2. In the third transistor region TTR, the gate electrode GE3 is formed from the conductive film CL2.

Further, in the memory region MCR, the tunnel oxide film TI is formed from the silicon oxide film HO2. In the first transistor region FTR, a gate oxide film GI1 is formed from the silicon oxide film CO. In the second transistor region STR, a gate oxide film GI2 is formed from the silicon oxide film OX. In the third transistor region TTR, a gate oxide film GI3 composed of silicon oxide films GI3a and GI3b is formed from the silicon oxide films HO1 and HO2.

Thereafter, although not shown in the drawing, the selective gate electrode WG is formed from the residual conductive film CL2 in the memory region MCR. Further, the drain region DR is formed in the memory region MCR, and impurity regions IR1, IR2, and IR3 constituting the source region and the drain region are formed in each of the transistor regions FTR, STR, and TTR, so that the semiconductor device according to the present embodiment shown in FIG. 24 is manufactured.

<Effect>

Next, the effects of the present embodiment will be described.

In the present embodiment, in the first transistor region FTR, the silicon oxide film CO is formed on the surface of the semiconductor substrate SB as shown in FIG. 26, and the silicon oxide films HO1 and HO2 (first etched film) are formed on the silicon oxide film CO as shown in FIG. 31. Thereafter, as shown in FIG. 32 and FIG. 33, the silicon oxide films HO1 and HO2 and a part of the upper layer of the silicon oxide film CO are removed by etching. As a result, the gate oxide film GI1 of the first transistor FT is formed from the silicon oxide film CO.

As described above, the thickness of the gate oxide film GI1 is adjusted by removing a part of the upper layer of the silicon oxide film CO by etching. This makes it possible to adjust the film thickness of the gate oxide film GI1 separately from the gate oxide films GI2 and GI3 of the second transistor ST and the third transistor TT. Therefore, it is possible to form the gate oxide film GI1 without significantly affecting the formation of the gate oxide films GI2 and GI3 of the second transistor ST and the third transistor TT.

Further, according to the present embodiment, the same effects as those of the first embodiment can be obtained in addition to those described above.

<First Modification>

In the third embodiment, the film thickness of the gate oxide film GI1 of the first transistor FT is controlled by only the overetching in the etching of the conductive film CL1, but the film thickness may be controlled by the combination of the overetching and the wet etching.

The manufacturing method according to this modification goes through the same steps as those of the third embodiment shown in FIG. 26 to FIG. 32. However, in the manufacturing method according to this modification, in the etching step of the conductive film CL1 by the CDE shown in FIG. 32, the selectivity with respect to the silicon oxide film is set as high as possible in order to stabilize the residual silicon oxide film CO. As a result, the amount of film loss of the silicon oxide film CO due to the overetching when removing the conductive film CL1 by etching is reduced.

Figure 37:
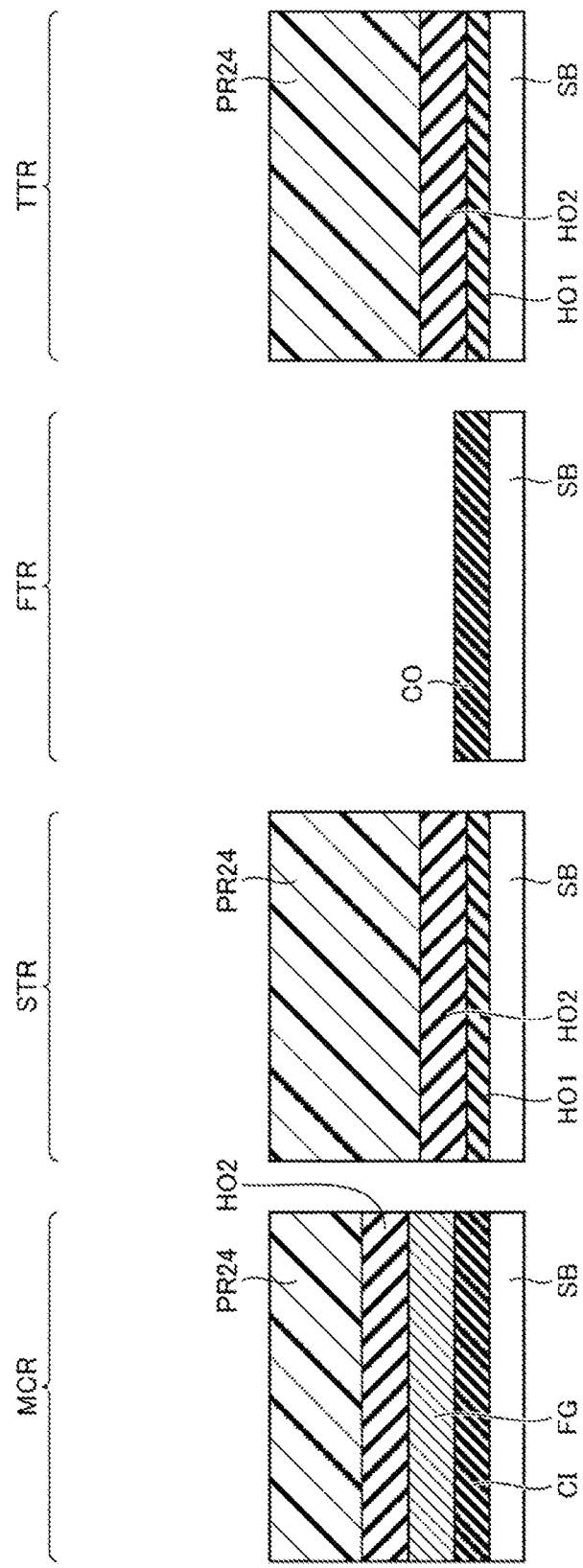
FIG. 37 is a cross-sectional view showing a first step of a method of manufacturing a semiconductor device according to a first modification of the third embodiment.

As shown in FIG. 37, the thickness of the residual silicon oxide film CO after etching by the CDE is set to, for example, 90 Å (angstrom).

Figure 38:
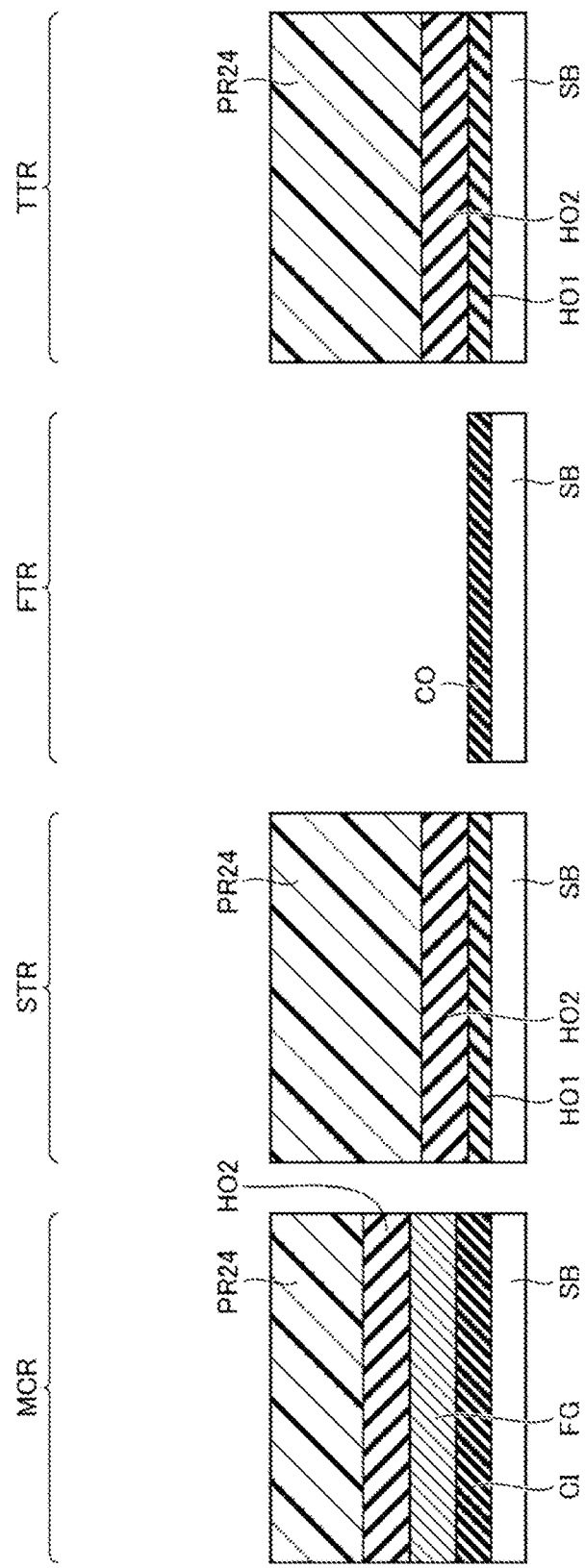
FIG. 38 is a cross-sectional view showing a second step of the method of manufacturing the semiconductor device according to the first modification of the third embodiment.

As shown in FIG. 38, thereafter, wet etching is performed using the resist pattern PR24 as a mask. By this wet etching, the silicon oxide film CO is selectively removed in the first transistor region FTR. As a result, the final thickness of the silicon oxide film CO is adjusted to, for example, 50 Å (angstrom).

Thereafter, the manufacturing method according to this modification goes through the same steps as those in the third embodiment shown in FIG. 34 to FIG. 36, so that the semiconductor device having the same configuration as the semiconductor device shown in FIG. 24 is manufactured.

According to this modification, the final thickness of the gate oxide film GI1 (CO) of the first transistor FT is adjusted to 50 Å (angstrom) as described above. Therefore, a transistor having a drive voltage of 2.5 V can be used as the first transistor FT instead of a transistor having a drive voltage of 3.3 V.

<Second Modification>

Also, in the third embodiment, the film thickness of the gate oxide film GI1 of the first transistor FT is controlled by the dry etching, but the film thickness may be controlled by the wet etching.

The manufacturing method according to this modification goes through the same steps as those of the third embodiment shown in FIG. 26 to FIG. 32. However, in the manufacturing method according to this modification, the CDE is stopped in the middle of the etching of the conductive film CL1 in the etching step of the conductive film CL1 by the CDE shown in FIG. 32.

Figure 39:
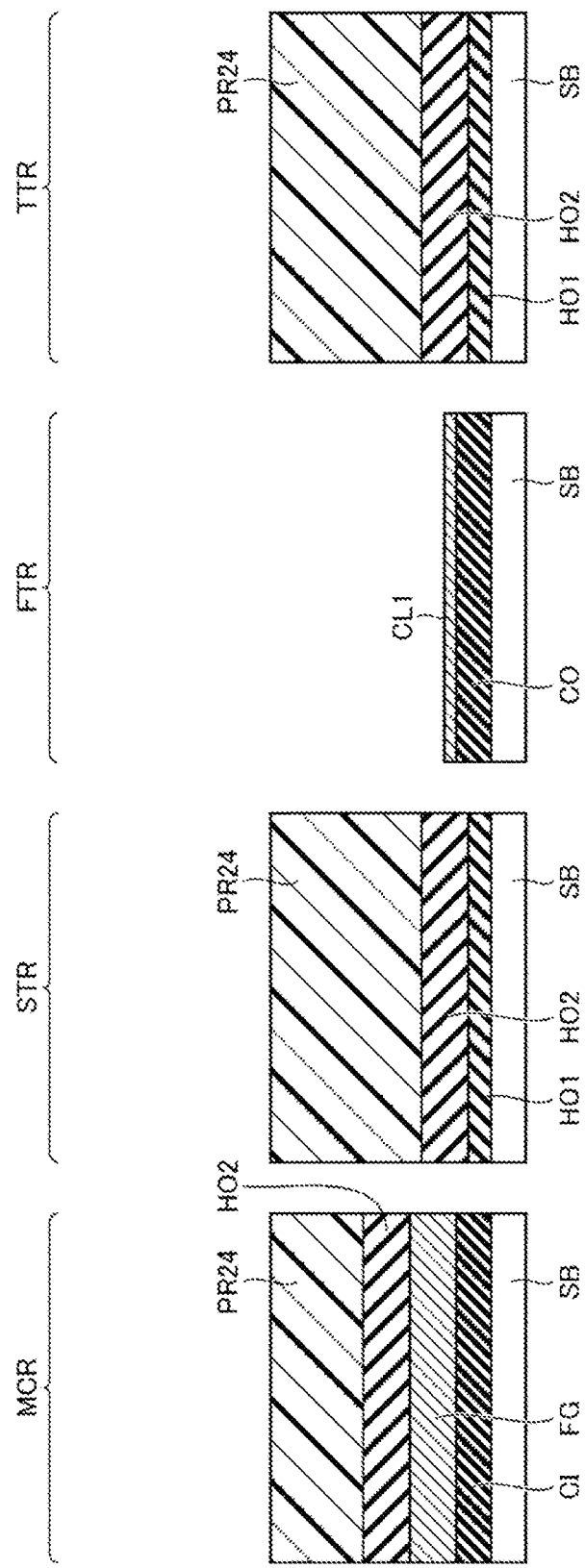
FIG. 39 is a cross-sectional view showing a first step of a method of manufacturing a semiconductor device according to a second modification of the third embodiment.

As shown in FIG. 39, by the etching by the CDE mentioned above, in the first transistor region FTR, only the upper part of the conductive film CL1 is removed so as to leave the lower part of the conductive film CL1. As a result, the lower part of the conductive film CL1 is thinly left on the silicon oxide film CO. Thereafter, the resist pattern PR24 is peeled off and removed by acid, and then wet etching is performed.

The wet etching is performed using high temperature DAPM (Dilute Ammonia hydrogen Peroxide Mixture). The condition of the high temperature DAPM is that the selectivity with respect to the silicon oxide film HO2 is high in order to minimize the amount of loss of the silicon oxide film HO2. Specifically, the conditions of the high temperature DAPM are, for example, $NH_4OH\ H_2O_2:H_2O=1:10:400$, and the temperature of 65° C.

By this wet etching, the residual film (lower part) of the conductive film CL1 and a part of the upper layer of the silicon oxide film CO are removed in the first transistor region FTR.

Figure 40:
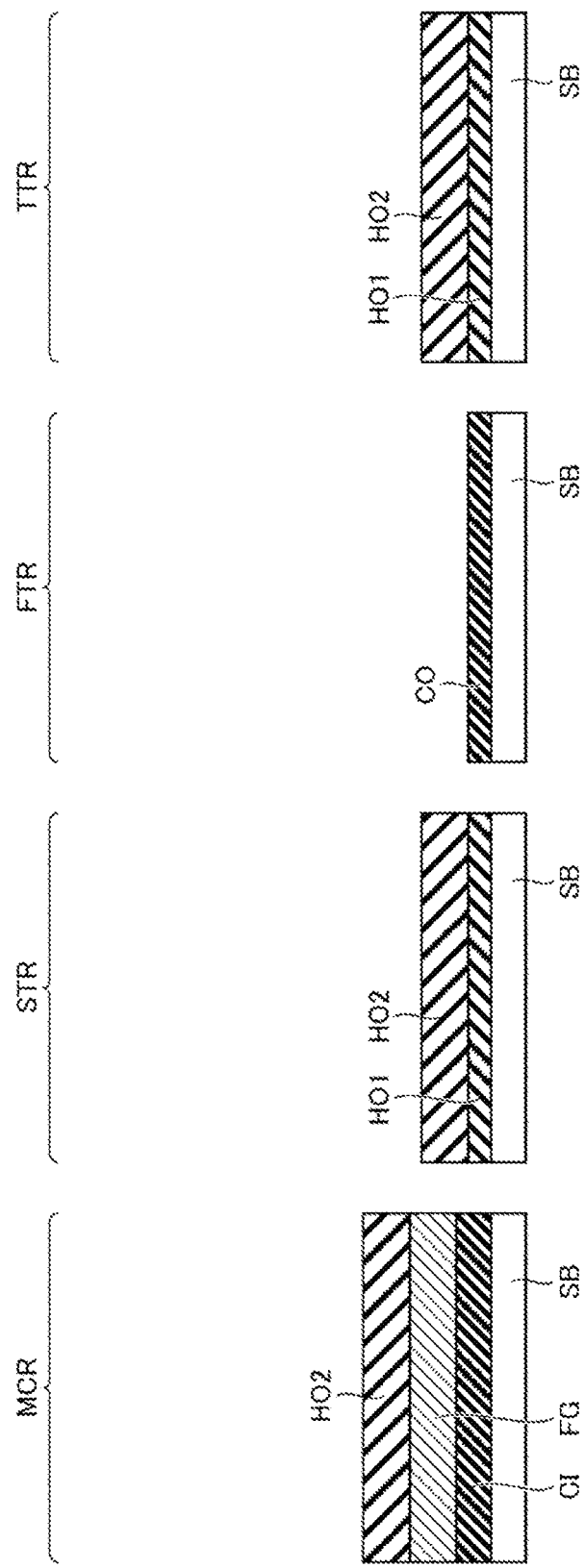
FIG. 40 is a cross-sectional view showing a second step of the method of manufacturing the semiconductor device according to the second modification of the third embodiment.

As shown in FIG. 40, by the wet etching mentioned above, the thickness of the silicon oxide film CO is adjusted to, for example, 75 Å (angstrom).

Thereafter, the manufacturing method according to this modification goes through the same steps as those in the third embodiment shown in FIG. 34 to FIG. 36, so that the semiconductor device having the same configuration as the semiconductor device shown in FIG. 24 is manufactured.

According to this modification, since the thickness of the silicon oxide film CO is adjusted by the wet etching as described above, it is possible to obtain the high-quality gate oxide film GI1 with less damage due to etching.

Although the case where the impurity regions IR, IR1, IR2, IR3, IRa, and IRb are n-type impurity regions has been described above, they may be p-type impurity regions. Further, the configuration of the non-volatile semiconductor memory MC is not limited to that described above, and any memory may be used as long as it can retain the memory without supplying power.

In the foregoing, the invention made by the inventors has been specifically described based on the embodiments, but the present invention is not limited to the embodiments described above and can be variously modified within the range not departing from the gist thereof.

What is claimed is:

1. A method of manufacturing a semiconductor device including a non-volatile semiconductor memory, a first transistor having a first gate oxide film with a first film thickness, a second transistor having a second gate oxide film with a second film thickness smaller than the first film thickness, and a third transistor having a third gate oxide film with a third film thickness larger than the first film thickness, the method comprising the steps of:
   (a) forming a first oxide film on a surface of a semiconductor substrate in formation regions of the first, second, and third transistors;
   (b) removing the first oxide film in the formation regions of the second and third transistors;
   (c) forming a first etched film on the first oxide film in the formation region of the first transistor and on the surface of the semiconductor substrate in the formation regions of the second and third transistors;
   (d) after the step (c), in the formation region of the first transistor, removing the first etched film and a part of an upper layer of the first oxide film, thereby forming the first gate oxide film with the first film thickness;
   (e) removing the first etched film in the formation region of the second transistor; and
   (f) after the step (e), in the formation region of the second transistor, forming a second oxide film on the surface of the semiconductor substrate, thereby forming the second gate oxide film with the second film thickness,
   wherein in the formation region of the third transistor, the first etched film forms the third gate oxide film with the third film thickness.

2. The method of manufacturing the semiconductor device according to claim 1, wherein, in the step (d), each of the first etched film and the part of the upper layer of the first oxide film is removed by dry etching.

3. The method of manufacturing the semiconductor device according to claim 2, wherein the first etched film has a stacked structure composed of three layers of a silicon oxide film, a silicon nitride film, and a silicon oxide film.

4. The method of manufacturing the semiconductor device according to claim 1, wherein, in the step (d), the first etched film is removed by wet etching, and the part of the upper layer of the first oxide film is removed by dry etching.

5. The method of manufacturing the semiconductor device according to claim 4, further comprising:
   (g) after the step (a) and before the step (b), forming a second etched film in the formation region of the first transistor,
   wherein the second etched film is a conductive film for forming a floating gate electrode in the non-volatile semiconductor memory.

6. The method of manufacturing the semiconductor device according to claim 4, wherein the first oxide film is an oxide film for forming a coupling oxide film in the non-volatile semiconductor memory.

7. The method of manufacturing the semiconductor device according to claim 1, wherein the part of the upper layer of the first oxide film is removed by chemical dry etching.

8. The method of manufacturing the semiconductor device according to claim 1, wherein the part of the upper layer of the first oxide film is removed by performing dry etching and then wet etching.

9. The method of manufacturing the semiconductor device according to claim 1, wherein the part of the upper layer of the first oxide film is removed by wet etching.

* * * * *